US012626759B1

(12) United States Patent
   Asnaashari

(10) Patent No.: US 12,626,759 B1
(45) Date of Patent: May 12, 2026

(54) ERROR CORRECTION FOR IDENTIFIER DATA GENERATED FROM UNCLONABLE CHARACTERISTICS OF RESISTIVE MEMORY

(71) Applicant: Crossbar, Inc., Santa Clara, CA (US)

(72) Inventor: Mehdi Asnaashari, Danville, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 18/412,022

(22) Filed: Jan. 12, 2024

Related U.S. Application Data

(62) Division of application No. 17/708,541, filed on Mar. 30, 2022.

(51) Int. Cl.
   *G11C 29/00* (2006.01)
   *G11C 13/00* (2006.01)
   *H03M 13/11* (2006.01)

(52) U.S. Cl.
   CPC ........ *G11C 13/0069* (2013.01); *G11C 13/004* (2013.01); *G11C 13/0059* (2013.01); *H03M 13/1105* (2013.01)

(58) Field of Classification Search
   None
   See application file for complete search history.

(56) References Cited

U.S. PATENT DOCUMENTS

| 9,559,113 B2 * | 1/2017 | Lai | H10B 43/35 |
|---|---|---|---|
| 9,755,831 B2 * | 9/2017 | Laver | H04L 9/0866 |
| 11,244,722 B2 * | 2/2022 | Kozicki | H01L 23/40 |
| 11,423,985 B2 * | 8/2022 | Redondo | G11C 11/56 |
| 2014/0268994 A1 | 9/2014 | Rose et al. | |
| 2015/0207624 A1 * | 7/2015 | Laver | H04L 9/0894 713/189 |
| 2015/0348624 A1 * | 12/2015 | Jang | G11C 13/0028 365/148 |
| 2016/0132388 A1 | 5/2016 | Kim | |
| 2016/0147599 A1 * | 5/2016 | Kim | G11C 29/52 714/764 |
| 2017/0046129 A1 * | 2/2017 | Cambou | H04L 63/06 |
| 2017/0048072 A1 * | 2/2017 | Cambou | G11C 15/046 |

(Continued)

OTHER PUBLICATIONS

International Search Report and Written Opinion of corresponding International Application No. PCT/US2023/065177 dated Jul. 12, 2023, 8 pages.

(Continued)

*Primary Examiner* — Mujtaba M Chaudry
(74) *Attorney, Agent, or Firm* — Wegman Hessler

(57) ABSTRACT

Leveraging stochastic physical characteristics of resistive switching devices to generate data having very low cross correlation among bits of that data is disclosed. Data generated from stochastic physical characteristics can also be referred to as physical unclonable feature—or function—(PUF) data. Additionally, error correction functions for PUF data generated from resistive switching memory cells are provided. The error correction functions facilitate additional redundancy and longevity of PUF data, among other benefits. Different embodiments include addressing arrangements to incorporate ECC parity bits among generated PUF data bits, even for differential PUF bits respectively defined by multiple memory cells in different portions of a resistive memory array.

5 Claims, 16 Drawing Sheets

(56)                    References Cited

U.S. PATENT DOCUMENTS

| | | | |
|---|---|---|---|
| 2018/0190352 A1* | 7/2018 | Hwang | H10N 70/8416 |
| 2019/0147948 A1 | 5/2019 | Cheng | |
| 2019/0295669 A1* | 9/2019 | Yang | G11C 16/32 |
| 2019/0333579 A1 | 10/2019 | Grossi et al. | |
| 2022/0013169 A1 | 1/2022 | Hall et al. | |
| 2022/0051718 A1 | 2/2022 | Asnaashari et al. | |
| 2022/0224776 A1* | 7/2022 | Doshi | G06F 12/0897 |
| 2023/0267988 A1* | 8/2023 | Liu | G11C 13/0004 |
| | | | 365/185.13 |

OTHER PUBLICATIONS

Notice of Allowance for corresponding U.S. Appl. No. 17/708,541 dated Jun. 13, 2023, 9 pages.
Notice of Allowance for corresponding U.S. Appl. No. 17/708,541 dated Oct. 4, 2023, 12 pages.
Restriction Requirement for corresponding U.S. Appl. No. 17/708,541 dated Sep. 1, 2023, 15 pages.

* cited by examiner

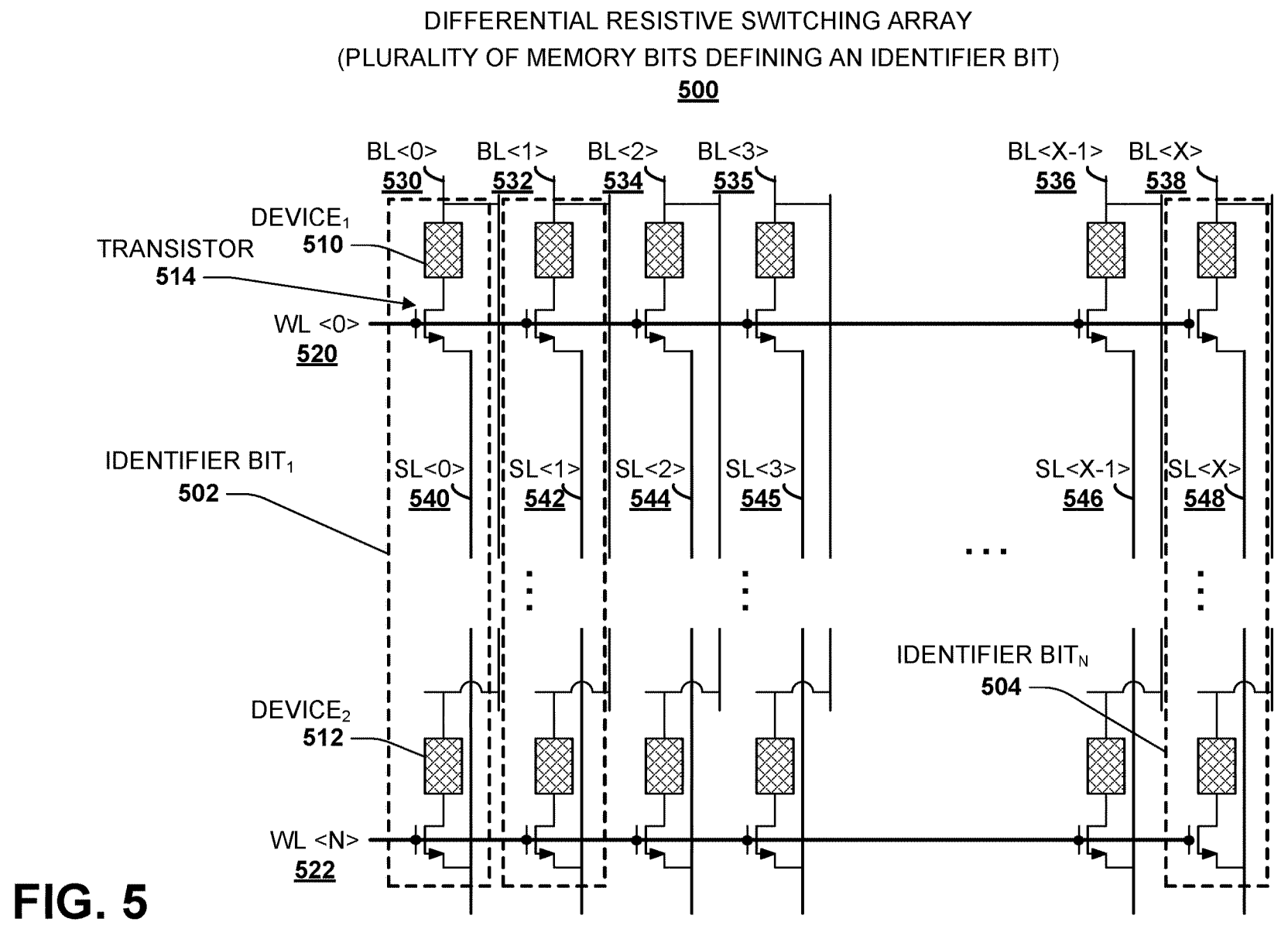

DIFFERENTIAL RESISTIVE SWITCHING ARRAY
(PLURALITY OF MEMORY BITS DEFINING AN IDENTIFIER BIT)
500

BL<0> 530
BL<1> 532
BL<2> 534
BL<3> 535
BL<X-1> 536
BL<X> 538

SL<0> 540
SL<1> 542
SL<2> 544
SL<3> 545
SL<X-1> 546
SL<X> 548

DEVICE₁ 510
TRANSISTOR 514
WL <0> 520
IDENTIFIER BIT₁ 502

DEVICE₂ 512
WL <N> 522
IDENTIFIER BIT_N 504

FIG. 5

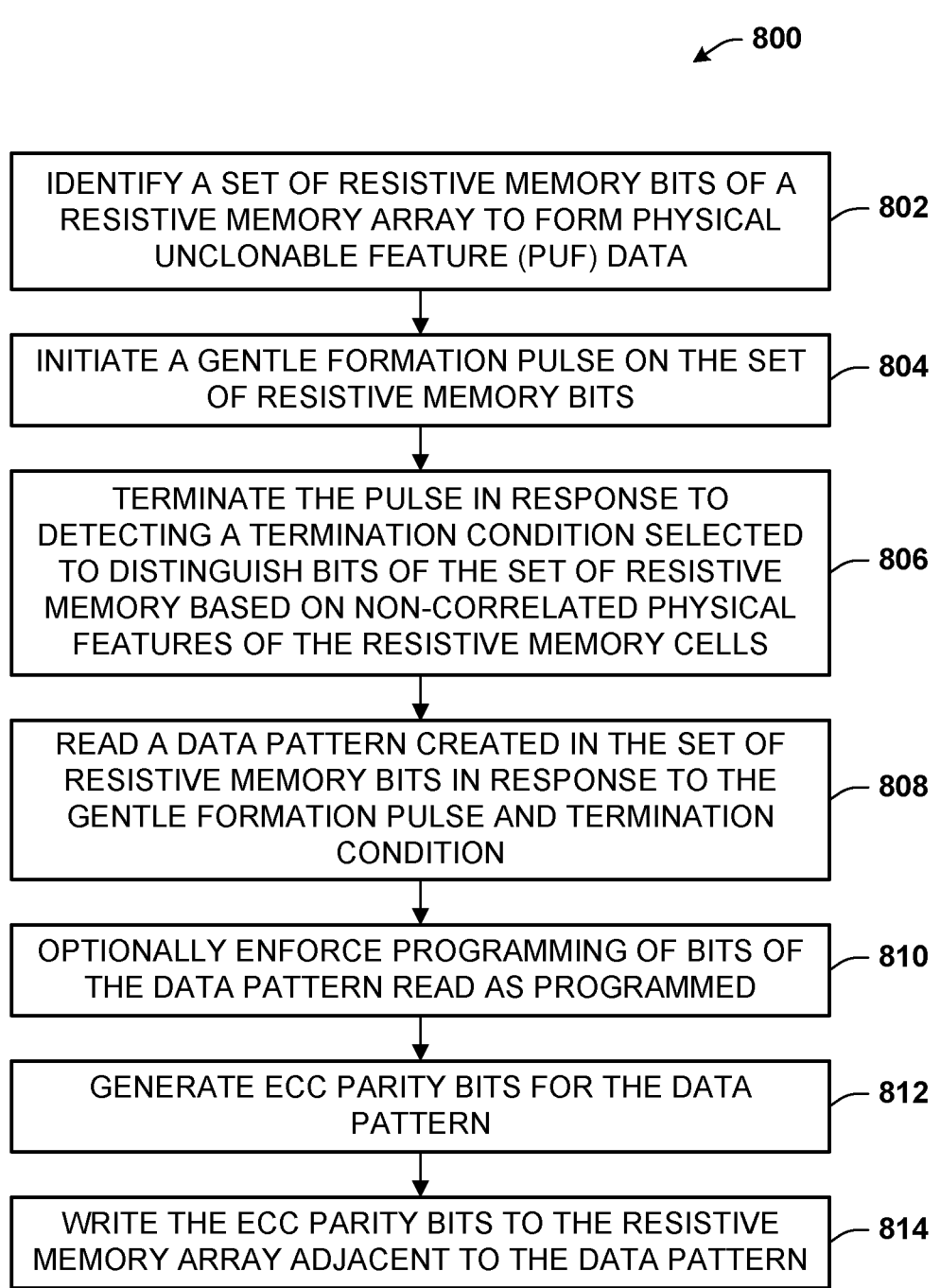

800

IDENTIFY A SET OF RESISTIVE MEMORY BITS OF A
RESISTIVE MEMORY ARRAY TO FORM PHYSICAL
UNCLONABLE FEATURE (PUF) DATA — 802

INITIATE A GENTLE FORMATION PULSE ON THE SET
OF RESISTIVE MEMORY BITS — 804

TERMINATE THE PULSE IN RESPONSE TO
DETECTING A TERMINATION CONDITION SELECTED
TO DISTINGUISH BITS OF THE SET OF RESISTIVE
MEMORY BASED ON NON-CORRELATED PHYSICAL
FEATURES OF THE RESISTIVE MEMORY CELLS — 806

READ A DATA PATTERN CREATED IN THE SET OF
RESISTIVE MEMORY BITS IN RESPONSE TO THE
GENTLE FORMATION PULSE AND TERMINATION
CONDITION — 808

OPTIONALLY ENFORCE PROGRAMMING OF BITS OF
THE DATA PATTERN READ AS PROGRAMMED — 810

GENERATE ECC PARITY BITS FOR THE DATA
PATTERN — 812

WRITE THE ECC PARITY BITS TO THE RESISTIVE
MEMORY ARRAY ADJACENT TO THE DATA PATTERN — 814

FIG. 8

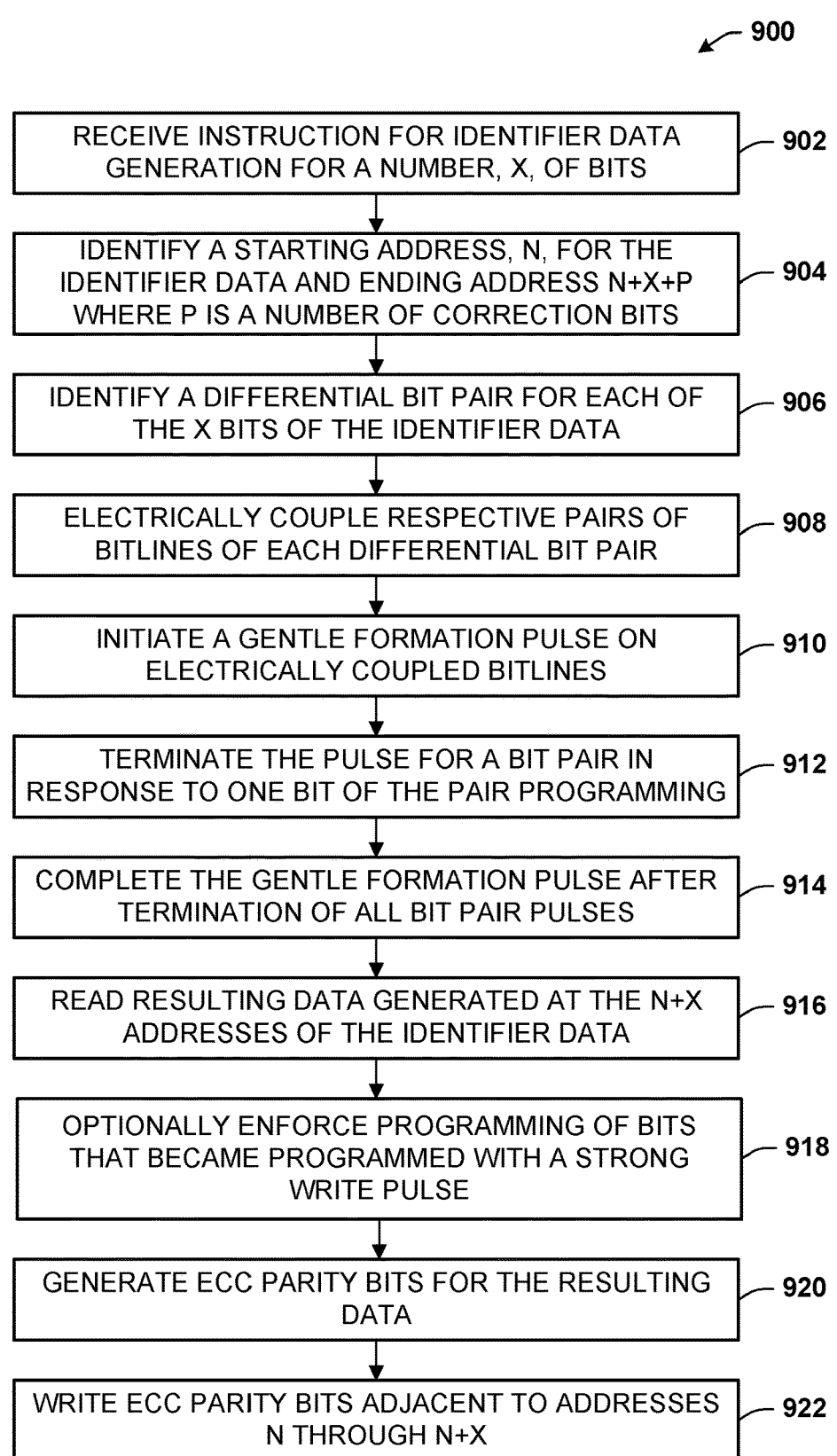

900

RECEIVE INSTRUCTION FOR IDENTIFIER DATA GENERATION FOR A NUMBER, X, OF BITS — 902

IDENTIFY A STARTING ADDRESS, N, FOR THE IDENTIFIER DATA AND ENDING ADDRESS N+X+P WHERE P IS A NUMBER OF CORRECTION BITS — 904

IDENTIFY A DIFFERENTIAL BIT PAIR FOR EACH OF THE X BITS OF THE IDENTIFIER DATA — 906

ELECTRICALLY COUPLE RESPECTIVE PAIRS OF BITLINES OF EACH DIFFERENTIAL BIT PAIR — 908

INITIATE A GENTLE FORMATION PULSE ON ELECTRICALLY COUPLED BITLINES — 910

TERMINATE THE PULSE FOR A BIT PAIR IN RESPONSE TO ONE BIT OF THE PAIR PROGRAMMING — 912

COMPLETE THE GENTLE FORMATION PULSE AFTER TERMINATION OF ALL BIT PAIR PULSES — 914

READ RESULTING DATA GENERATED AT THE N+X ADDRESSES OF THE IDENTIFIER DATA — 916

OPTIONALLY ENFORCE PROGRAMMING OF BITS THAT BECAME PROGRAMMED WITH A STRONG WRITE PULSE — 918

GENERATE ECC PARITY BITS FOR THE RESULTING DATA — 920

WRITE ECC PARITY BITS ADJACENT TO ADDRESSES N THROUGH N+X — 922

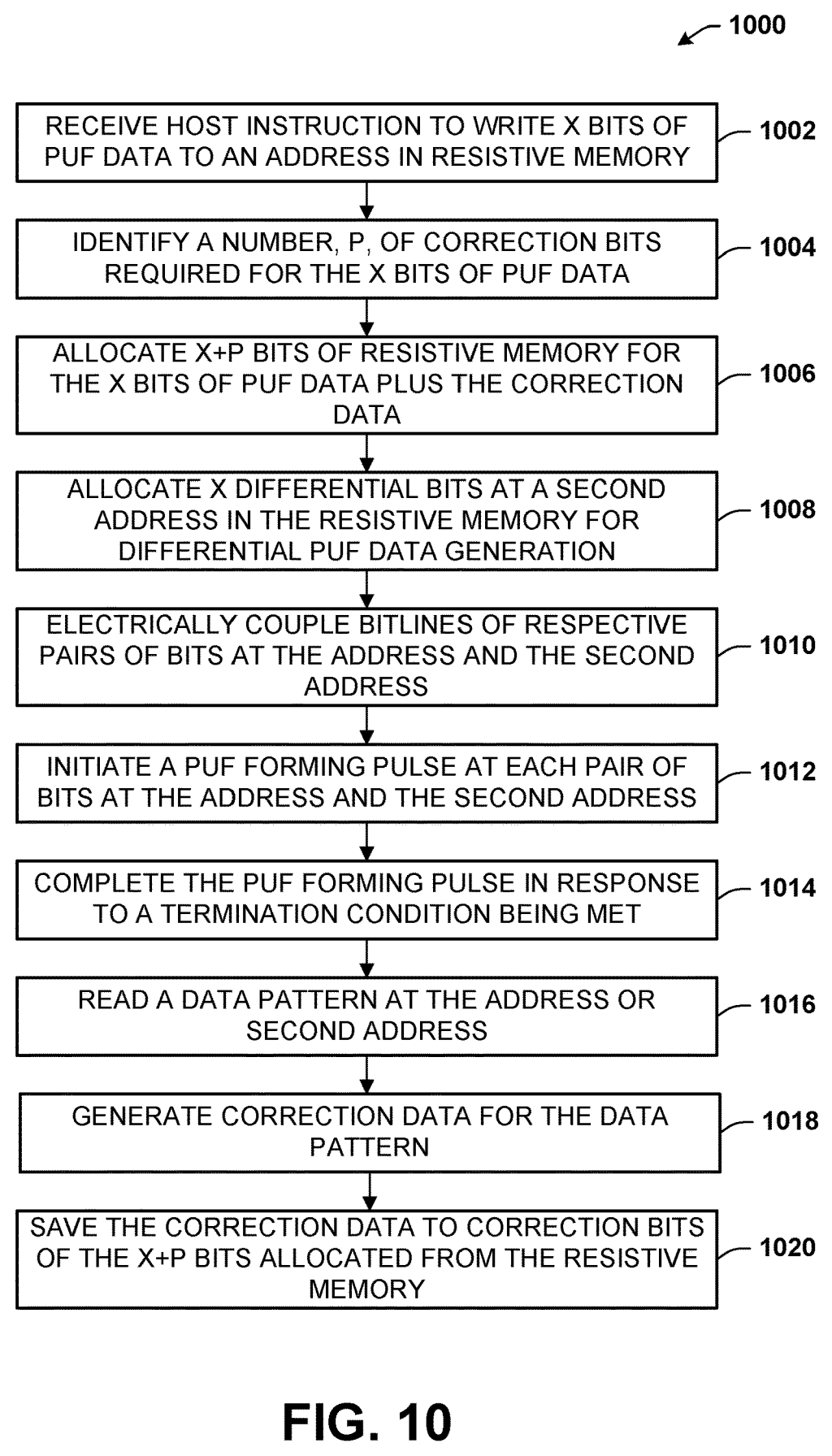

RECEIVE HOST INSTRUCTION TO WRITE X BITS OF PUF DATA TO AN ADDRESS IN RESISTIVE MEMORY — 1002

↓

IDENTIFY A NUMBER, P, OF CORRECTION BITS REQUIRED FOR THE X BITS OF PUF DATA — 1004

↓

ALLOCATE X+P BITS OF RESISTIVE MEMORY FOR THE X BITS OF PUF DATA PLUS THE CORRECTION DATA — 1006

↓

ALLOCATE X DIFFERENTIAL BITS AT A SECOND ADDRESS IN THE RESISTIVE MEMORY FOR DIFFERENTIAL PUF DATA GENERATION — 1008

↓

ELECTRICALLY COUPLE BITLINES OF RESPECTIVE PAIRS OF BITS AT THE ADDRESS AND THE SECOND ADDRESS — 1010

↓

INITIATE A PUF FORMING PULSE AT EACH PAIR OF BITS AT THE ADDRESS AND THE SECOND ADDRESS — 1012

↓

COMPLETE THE PUF FORMING PULSE IN RESPONSE TO A TERMINATION CONDITION BEING MET — 1014

↓

READ A DATA PATTERN AT THE ADDRESS OR SECOND ADDRESS — 1016

↓

GENERATE CORRECTION DATA FOR THE DATA PATTERN — 1018

↓

SAVE THE CORRECTION DATA TO CORRECTION BITS OF THE X+P BITS ALLOCATED FROM THE RESISTIVE MEMORY — 1020

FIG. 10

REFERENCE AND CONTROL SIGNAL GENERATOR(S) 1118

CONTROLS

STATE MACHINE 1120

ROW CONTROL 1104

MEMORY ARRAY 1102

COMMAND INTERFACE 1116

C&A

SENSE AMPS 1108

SIGNAL IN

SIGNAL OUT

INPUT/OUTPUT BUFFER 1112

COLUMN CONTROL 1106

CLOCK SOURCE(S) 1110

I/O

ADDRESS REGISTER 1114

ERROR CORRECTION FOR IDENTIFIER DATA GENERATED FROM UNCLONABLE CHARACTERISTICS OF RESISTIVE MEMORY

CROSS-REFERENCE TO RELATED APPLICATION

This application for patent is a divisional of and claims priority to U.S. application Ser. No. 17/708,541, titled ERROR CORRECTION FOR IDENTIFIER DATA GENERATED FROM UNCLONABLE CHARACTERISTICS OF RESISTIVE MEMORY and filed Mar. 30, 2022, which is hereby incorporated by reference herein in its entirety and for all purposes.

INCORPORATION BY REFERENCE

Each of the following: U.S. patent application Ser. No. 17/223,817 filed Apr. 6, 2021, U.S. patent application Ser. No. 17/223,816 filed Apr. 6, 2021, U.S. patent application Ser. No. 17/223,824 filed Apr. 6, 2021 and U.S. Provisional Patent Application No. 63/005,879 filed Apr. 6, 2020 are hereby incorporated by reference herein in their respective entireties and for all purposes.

TECHNICAL FIELD

The subject disclosure relates generally to two-terminal resistive switching memory, and as one illustrative example, providing error correction for identifier data formed from stochastic characteristics of resistive switching memory cells.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

Monolithic integration of resistive-switching memory within integrated circuit processes has been supported by other proposed models. Some models of resistive-switching memory are designed for front-end-of-line processing on a substrate, whereas other models are designed for back-end-of-line processing above the substrate. As a result, resistive-switching memory is expected to be compatible with embedded memory applications to support various integrated circuit devices as well as a stand-alone integrated circuit memory chip.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide for leveraging physical characteristics of resistive switching devices to generate data having very low cross correlation among bits of that data. Such data can be utilized for identifier data for identifying a chip (chip ID), a cryptographic key for security functions such as Elliptic curve cryptography, Advanced Encryption System (AES), and HMAC, and the like. Further embodiments disclose providing error correction functions for data generated from physical characteristics of the resistive switching device. Error correction functions can include error correction code for controlling data errors pertaining to such data. Examples of suitable error correction code can include Hamming code or other block code (e.g., Reed-Solomon code, Golay code, BCH, multi-dimensional parity code, low density parity check (LDPC) code, and so forth), convolutional code (e.g., Viterbi algorithm, MAP algorithm, BCJR algorithm, etc.), forward error correction code (e.g., Marker code, Watermark code, and so forth), among many other error correction codes.

In an embodiment, disclosed is a method of operating a resistive memory array of an integrated circuit device. The method can comprise identifying a set of resistive memory bits of the resistive memory array to form a data sequence from native physical characteristics of the resistive memory bits, initiate a formation pulse on the set of resistive memory bits and terminate the formation pulse in response to detecting a termination condition selected to program a portion of the set of resistive memory bits. Moreover, the method can comprise read a data pattern created in the set of resistive memory bits in response to the formation pulse, generate error correction code (ECC) data that corresponds to the data pattern and write the ECC data to the resistive memory array.

In yet another embodiment(s), the present disclosure provides an integrated circuit (IC) device. The integrated circuit device can comprise a resistive switching memory array comprising a plurality of resistive switching devices disposed overlying a substrate, wherein the plurality of resistive switching devices is associated with an operational programming characteristic having low correlation among resistive switching devices of the plurality of resistive switching devices. The IC device can further comprise a control circuit for segregating a subset of the plurality of resistive switching devices thereby defining a first subset of the resistive switching devices for generating a data sequence based on the operational characteristic having the correlation coefficient, and can comprise an error correction control (ECC) encoder configured to generate correction data for a data sequence stored at the resistive switching memory array. Additionally, the IC device can comprise a sensing circuit disposed at least in part on the substrate and electrically coupled to the plurality of resistive switching devices, wherein the sensing circuit is configured to selectively apply a sense signal to a first resistive switching device of a first subset of the resistive switching devices, wherein the sensing circuit is configured to determine a first response signal from the first resistive switching device in response to the sense signal, and wherein the sensing circuit is configured to selectively apply the sense signal to a second resistive switching device of the first subset of the resistive switching devices, wherein the sensing circuit is configured to determine a second response signal from the second resistive switching device in response to the sense signal. In various embodiments, the control circuit can define a bit for the first resistive switching device and the second resistive switching device and the control circuit can establish a logic value for the bit based on the determined first response signal and second response signal. In still additional embodiments, the control circuit can establish additional logic values for additional bits defined for additional pairs of the plurality of resistive switching devices, the bit and the additional bits defining a sequence of data, and the ECC encoder can generate error correction data corresponding to the sequence of data.

According to one or more additional embodiments, the present disclosure provides a method. The method can comprise: initiate a physical unclonable feature (PUF) write process for generating identifier data at a resistive switching memory array, determine a number, X, of bits for the PUF write and first addresses within the resistive switching memory array corresponding to a plurality of resistive switching memory cells targeted for the PUF write and identify a number, P, of correction bits required for the X bits of identifier data. The method can additionally comprise: allocate X+P bits of resistive memory for the X bits of identifier data plus the correction bits, allocate X differential bits at second addresses in the resistive memory for differential cell generation of the identifier data and electrically couple bitlines of respective pairs of bits from the first addresses and the second addresses, wherein each pair of bits comprises one resistive memory cell from the first addresses and one resistive memory cell from the second addresses. The method can still further comprise: initiate a forming pulse for the PUF write at each pair of bits at the first addresses and the second addresses, complete the forming pulse in response to a termination condition, and read a data pattern generated in the X bits of identifier data at the first addresses in response to the forming pulse. The method can also comprise: generate correction data for the data pattern and save the correction data to the P bits of the resistive memory allocated for the correction bits.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 5 illustrates a schematic diagram of an arrangement of multiple resistive memory cells to define an identifier bit according to other embodiments;

FIG. 8 illustrates a flowchart of a sample method providing error correction for physical unclonable feature (PUF) data of a resistive memory device, in further embodiments;

FIG. 9 depicts a flowchart of an example method for implementing a resistive memory identifier write with error correction bits, in still other embodiments;

FIG. 10 illustrates a flowchart of a sample method for implementing a host-originated resistive memory identifier write with error correction, in additional embodiments;

DETAILED DESCRIPTION

Introduction

Figure 1:
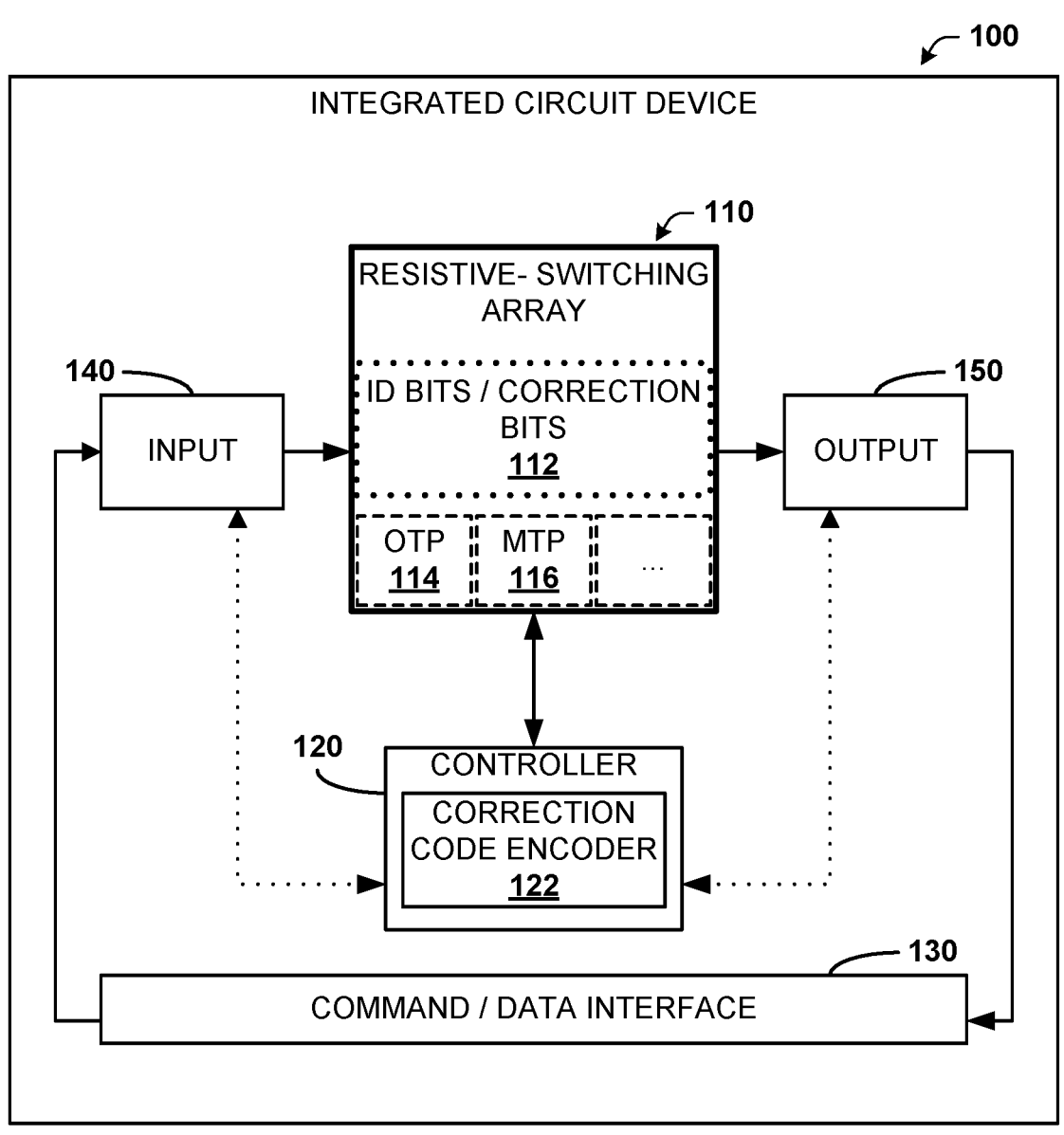
FIG. 1 illustrates a block diagram of an example integrated circuit (IC) device providing error correction for resistive memory identifier data, in an embodiment.

One or more embodiments of the present disclosure leverage stochastic or substantially stochastic physical characteristics of nano-scale resistive switching devices to generate data. Being generally random, stochastic features of resistive switching devices can be leveraged to produce data that has little to no correlation among different bits of the data or subsets of those bits. As a result, data produced from stochastic physical characteristics of resistive switching devices can be suited to applications requiring distinct or unique identification, such as identification and authorization applications pertaining to a device (e.g., a semiconductor die—also referred to herein as a semiconductor chip—or a semiconductor wafer, group(s) of dies, group(s) of wafers, an electronic device incorporating a semiconductor die(s), and so forth). Further, highly non-correlated data can also be utilized for security applications, such as random number generation, cryptographic key generation applications, and the like.

Stochastic physical characteristics can also be referred to as physical unclonable functions (PUF), physically unclonable functions, physical(ly) unclonable features, or other suitable nomenclature. Data derived from such stochastic physical characteristics are referred to herein as PUF data (or a PUF bit, or group of PUF bits, etc.) and generally involve a resistive switching cell process applied to one or more resistive switching cells that define a PUF bit(s) (e.g., see U.S. patent application Ser. No. 17/223,817 filed Apr. 6, 2021, incorporated by reference hereinabove). PUF data can be generated from a cell process(es) applied to native resistive switching memory cells (sometimes referred to as virgin resistive switching memory cells) that have not had a memory process previously applied to those memory cells, following manufacture. Example memory processes can include a forming process (e.g., comprising one or more electrical forming pulses), a program process (e.g., comprising one or more electrical program pulses), an erase process (e.g., comprising one or more electrical erase pulses), an overwrite process, and so forth. In addition, PUF data generated from non-volatile resistive switching memory cells can thereafter be stored and read from at least a subset of the non-volatile resistive switching memory cells utilized to generate the PUF data.

Further embodiments of the present disclosure provide error correction features for data produced from stochastic (substantially stochastic) physical characteristics of resistive switching devices (PUF data). In some embodiments, error correction features can include utilizing an error correction encoder in conjunction with generation of PUF data to generate correction data for the PUF data. The correction data can be configured to identify or identify and correct one or more erroneous bits of the PUF data following generation of the PUF data. The correction data can be stored adjacent to non-volatile resistive switching memory cells from which the PUF data is generated, in at least some embodiments. In an embodiment(s), the error correction encoder can utilize a suitable error correction code. Examples of suitable error correction code can include a block code (e.g., Hamming code, Reed-Solomon code, Golay code, BCH, multidimensional parity code, low density parity check (LDPC) code, and so forth), a convolutional code (e.g., Viterbi algorithm, MAP algorithm, BCJR algorithm, etc.), a forward error correction code (e.g., Marker code, Watermark code, and so forth), or other suitable error correction code, or a suitable combination of the foregoing (e.g., a concatenated block and convolutional code, a turbo code combining two or more convolutional codes with an interleaver, among others).

In at least one embodiment, error correction features can be implemented for PUF data in addition to program enforcement of programmed bits of the PUF data. Program enforcement can include a strong program process, which can include substantially stronger voltage magnitude, pulse duration, number of pulses, etc., than a formation pulse for establishing the PUF data. In an embodiment, program enforcement can include implementing a one-time programmable (OTP) pulse to cause the programmed bits of the PUF data to be non-erasable. This can enhance longevity of the PUF data, reducing likelihood that a programmed bit may become unprogrammed over time, as one example.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one ordinary skill in the art, or a reasonable variation of a specified quality(ies) or quantity(ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (A), the relative term "about" can mean reasonable variances about 50 A that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality(ies) or quantity(ies) that would be suitable to accomplish one or more explicitly disclosed function(s) or feature(s) of a disclosed element. Accordingly, the subject specification is by no means limited only to specific qualities and quantities disclosed herein but includes all variations of specified quality(ies) or quantity(ies) reasonably conveyed to one of ordinary skill in the art by way of the context disclosed herein.

Integrated circuit techniques for fabricating resistive switching memory can cause physical properties having the stochastic or substantially stochastic characteristics desired for generating PUF data. For instance, these physical properties can have little or no replication or repetition among fabricated memory cells made by the same process. As one example, one or more layers of a disclosed resistive switching device can have a root mean square (RMS) surface roughness of >0.2 nm, up to a maximum of about 10.0 nm surface roughness, in an embodiment. This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching device properties such as: native or virgin (e.g., as fabricated) current conductance, program voltage, differential program voltage, program speed, differential program speed, among others disclosed throughout this specification. As further examples, different resistive-switching memory cells and cell technologies can have different discrete programmable resistances, different associated program/erase voltages, as well as other differentiating characteristics. In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve stochastic physical characteristics disclosed herein. In other embodiments, a 22 nm photolithographic process producing a device size

7 | 8 between 40 nm and 100 nm width (e.g., about 44 nm width, about 60 nm width, about 66 nm width, about 88 nm width, and so forth) can achieve stochastic physical characteristics.

In addition to the foregoing, stochastic physical features of resistive switching devices can vary among devices in a die and among devices on a wafer or multiple wafers. As a result, minimal correlation in the native physical features among devices, dies, wafers and so forth, can yield minimal correlation between operational processes and data derived from such processes among devices, dies, wafers and the like. For instance, a native electrical resistance of a resistive switching layer (RSL) can depend at least in part on these non-correlated physical features and can vary from device to device even for adjacent devices in a single array on a single die (and, as previously stated, among multiple dies, wafers, and so on). Further, a current flow through the RSL in a native un-programmed state, a program voltage in the native un-programmed state, a program speed in the native un-programmed state, differential program voltage/current/speed in the native un-programmed state, and so on, can vary among resistive switching devices. Processes disclosed herein for forming resistive switching devices and for leveraging stochastic or substantially stochastic physically unclonable features of resistive switching devices can provide excellent non-correlated data sequences.

As utilized herein, the term "native", "original", "virgin" or the like refers to post-fabrication but pre-commercial operation of resistive switching devices on a semiconductor die. Native (and like terminology) need not exclude some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory—such as PUF data—within an array of resistive switching memory), among others. In general, a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., SiON, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g., AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. In response to a program process applied to the non-volatile memory device, the large number of voids or defects can facilitate formation of a thick, stable structure of the neutral metal particles. In such a structure, these trapped particles can maintain the non-volatile memory device in a low resistance state in the absence of an external stimulus (e.g., electrical power applied to an erase process), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external selector activation stimulus (e.g., an electric field, voltage, current, joule heating, or a suitable combination thereof). Moreover, the particles can be selected to have high surface energy, and good diffusivity within the RSL. This leads to a conductive filament that can form rapidly in response to the selector activation stimulus, but also deform quite readily, e.g., in response to the selector activation stimulus dropping below a deformation magnitude (which can be lower than a formation magnitude of the external stimulus associated with forming the volatile conductive filament, e.g., in response to a current flowing through the selector device; see U.S. Pat. No. 9,633,724 B2 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: $0<x<2$, $0<x<3$, $0<x<4$ or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_a N_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures and are not intended to denote a same or similar value or ratio among the compounds. Mixtures can refer to non-stoichiometric materials with free elements therein—such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art. Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In some disclosed embodiments, completion of a conductive filament can involve only a few particles (e.g., atoms, ions, conductive compounds, etc.) of conductive material, or less. As one particular example, an electrically continuous conductive filament could be established by position of 1-3 atoms at a boundary of a switching layer, whereas repositioning of one or more of these atoms can break that electrical continuity, in some embodiments. Because the scale is so small between a completed filament and non-completed filament, illicit side-channel attempts to read bits of memory—for example through high intensity microscopy—can be very difficult, if not impossible due to the difficulty of imaging such small particles and determining whether their location is sufficient to establish electrical continuity. Still further, disclosed resistive switching devices can be formed among metal lines of a semiconductor chip (e.g., among backend-of-line wiring layers). The density of metal wiring layers further occludes visibility of the resistive switching devices, making common side-channel techniques unprofitable.

Following program or erase pulses for a non-volatile two-terminal resistive memory cell, a read pulse can be asserted. This read pulse is typically lower in magnitude relative to program or erase pulses and typically insufficient to affect the conductive filament and/or change the state of the two-terminal resistive memory cell. By applying a read pulse to one of the electrodes of the two-terminal memory, a measured current (e.g., $I_{on}$) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory cell, suitable for a given two-terminal memory technology. For example, when the conductive filament has been formed (e.g., in response to application of a program pulse), the conductance of the cell is greater than otherwise and the measured current (e.g., $I_{on}$) reading in response to the read pulse will be greater. On the other hand, when the conductive filament is removed or deformed so as to lose electrical continuity (e.g., in response to application of an erase pulse), the resistance of the cell is high because the interface layer has a relatively high electrical resistance, so the conductance of the cell is lower and the measured current (e.g., $I_{off}$) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state, or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

Overview

FIG. 1 illustrates a block diagram of an example integrated circuit device 100 for an electronic device according to one or more embodiments of the present disclosure. Integrated circuit device 100 includes an array(s) of resistive-switching memory cells 110. Array(s) of memory 110 can include resistive switching memory cells, and different portions of the resistive switching memory cells can be categorized for different memory cell functions. Example memory cell functions can include physical identifier (or physical unclonable feature (PUF)) functions, one-time programmable functions and many-time programmable functions (also referred to as rewritable or program/erase functions). Different groups of memory cells of array of resistive-switching memory cells 110 are provided to implement these functions. Thus, depicted in FIG. 1 are PUF memory cells 112, one-time programmable (OTP) memory cells 114 as well as many-time programmable (MTP) or reversibly programmable memory cells 116. Other types of memory cell functions can be included for different portions of array(s) of resistive-switching memory cells 110, though not specifically depicted in FIG. 1.

In embodiments disclosed by the present application, controller 120 can include a correction code controller 122 configured to generate error correction data for PUF data, OTP data or MTP data stored in PUF memory cells 112, OTP memory cells 114 or MTP memory cells 116, respectively. Correction code encoder 122 can incorporate one or more error correction algorithms to generate the error correction data. These error correction algorithms can include any suitable error correction algorithm known in the art or reasonably conveyed to one of ordinary skill in the art by way of the context provided herein. Examples include: a block code algorithm (e.g., Hamming code, Reed-Solomon code, Golay code, BCH, multidimensional parity code, low density parity check (LDPC) code, and so forth), a convolutional code algorithm (e.g., Viterbi algorithm, MAP algorithm, BCJR algorithm, etc.), a forward error correction code algorithm (e.g., Marker code, Watermark code, and so forth), or other suitable error correction code, or a suitable combination of the foregoing (e.g., a concatenated algorithm incorporating a block code algorithm and a convolutional code algorithm, a turbo code algorithm combining two or more convolutional code algorithms with an interleaver, among others).

In the context of PUF data, in response to receiving a PUF write command controller 120 can initiate a PUF data generation command, allocating one or more bytes of PUF memory cells 112 to generating a PUF data sequence. In various embodiments, the PUF write command can specify an address(es) within PUF memory cells 112 for generating the PUF data sequence, but controller 120 is not so limited, and in other embodiments controller 120 can select the address(es) for generating the PUF data sequence. The PUF write command will not specify data to be written to the address(es) for generating the PUF data sequence; the PUF data sequence will be generated in response to the PUF data generation command.

In response to generating the PUF data sequence, controller 120 can then read the data written to the one or more bytes of PUF memory cells 112 to determine the data sequence. In at least one embodiment, where two or more cells are defined for generating each PUF data bit (also referred to as differential PUF data generation), controller 120 can select a suitable subset of the byes of PUF memory cells 112 containing the generated PUF data sequence (or an inversion of the generated PUF data sequence) and read only the suitable subset of the bytes of PUF memory cells 112. Upon reading the generated PUF data sequence, correction code controller 122 can generate correction bits (e.g., parity bits, and so forth) utilizing a suitable error correction algorithm incorporated by correction code encoder 122. Once generated, the correction bits can be stored within PUF memory cells 112, in one or more disclosed embodiments (e.g., see FIGS. 3, 4, 7 and 7A, infra). Thus, as illustrated in FIG. 1, PUF memory cells 112 can include both identifier bits (e.g., the PUF data) as well as correction bits associated with the identifier bits (e.g., parity bits, or other correction algorithm bits).

In an embodiment, correction bits can be appended after the byte(s) of PUF memory cells 112 from which the PUF data sequence is generated. In another embodiment, correction bits can be interleaved among bytes of PUF memory cells 112 from which the PUF data sequence is generated. In still other embodiments, correction bits can be in part appended before and in further part appended after the byte(s) of PUF memory cells 112 from which the PUF data sequence is generated. In yet another embodiment(s), portions of correction bits can be interleaved among bytes of PUF memory cells 112 from which the PUF data sequence is generated, with a first subset of a portion appended before a given byte and a second portion appended after the given byte. According to further embodiments still, correction bits can be written in a suitable combination of any of the foregoing. In at least one embodiment, correction bits can be written to memory cells defined according to any of the foregoing relationships to a subset of differential PUF memory cells 112 defining an instance of the PUF data sequence (or inversion thereof).

In various embodiments, array(s) of memory 110 can include non-volatile two-terminal resistive-switching memory devices, volatile two-terminal resistive-switching devices, or a combination of non-volatile two-terminal resistive-switching memory devices and volatile two-terminal resistive-switching devices (e.g., serving as a selector device for a non-volatile memory, or independently as a volatile latch, switch, or the like). In some embodiments, array(s) of memory 110 can include other memory cell technologies, such as phase change memory, oxygen vacancy memory cells, magnetic memory, spin-torque transfer magnetic memory, programmable metallization memory, conductive bridge memory, and so forth.

In one or more embodiments, PUF memory cells 112 can be separate memory structures from array(s) of memory 110 (e.g., located in an additional array(s) physically separate from array(s) of memory 110 within a semiconductor chip— not depicted by FIG. 1) or can be at least in part included within array(s) of memory 110 as depicted in FIG. 1 (e.g., an array among a set of arrays that embody array(s) of memory 110, a block of memory within such an array(s), a set of pages within one or more blocks or arrays, or other suitable arrangement). In one embodiment(s), PUF memory cells 112 and OTP memory cells 114 can have a fixed size/number of memory cells and be pre-allocated within integrated circuit device 100. In other embodiments, PUF memory cells 112 and OTP memory cells 114 can have variable size or location controllable post-fabrication. For instance, a number of memory cells allocated to PUF operation or OTP operation can be dynamically increased or decreased by way of controller 120. In still other embodiments, resistive switching memory cells of array(s) of memory 110 can have no predetermined assignment or function as PUF operation, OTP operation or MTP operation, and instead can be dynamically attributed by way of controller 120 in response to a host command received over command/data interface 130 by a host device (not depicted, but see FIGS. 11 and 12, infra) that includes an assignment of PUF operation, OTP operation or MTP operation in conjunction with the host command. Any other suitable allocation or re-allocation of assignments/functions of PUF, OTP or MTP that would be evident to one of ordinary skill in the art based on the context provided herein is deemed to be within the scope of the present disclosure and can be provided by or through controller 120 as well. However, in some embodiments, if memory has been used for fingerprinting (identifier sequence/PUF data) or programmed as OTP data, such memory can be prevented by controller 120 from being reallocated as general purpose memory (or another assignment or function of memory).

Also illustrated in integrated circuit device 100 is an input(s) 140 and output(s) 150. In some embodiments, input(s) 140 can include (or provide a pathway for) data to be stored within array(s) of memory 110, PUF memory cells 112 or OTP memory cells 114. Output(s) 150 can output data stored within array(s) of memory 110, PUF memory cells 112 or OTP memory cells 114. In some embodiments, output(s) 150 can output data that results from computations utilizing data stored in PUF memory cells 112 or stored within array(s) of memory 110 or OTP memory cells 114 resulting from such computations, in further embodiments.

FIG. 1 provides a mechanism for exporting control over the selection of memory cells for physically unclonable identifier sequence generation, post-fabrication. Resistive switching memory cells of array of resistive-switching memory 110 can have very low inherent bit error rates due to the non-volatile nature of array of resistive-switching memory 110 and the reliability of such memory cells. In contrast, identifier sequence bits generated from static random access memory (SRAM) typically involve fairly high bit error rate (BER), from 3% to 15% depending on implementation. To reduce BER associated with SRAM identifier sequence generation, complicated circuitry is coupled to the SRAM bits upon fabrication. This permanently fixes the SRAM bits that can be utilized for identifier sequence generation, and further adds significant hardware overhead to a semiconductor die. As a result, useful SRAM identifier bits are generally not selectable post-fabrication. Because disclosed resistive switching devices can generate identifier sequence data with extremely low BER without the extraneous circuitry, integrated circuit device 100 is not so limited. Moreover, the lack of additional circuitry to support low BER identifier operations enables portions of array of resistive switching memory cells 110 to be selectable for different operations, as described above. Accordingly, embodiments disclosed herein provide circuitry and processes utilized for memory operations of the resistive switching devices (e.g., for storing data, for reading data, for rewriting data, etc.) and extend them to generating identifier sequence data. In such embodiments, resistive switching devices utilized for memory operations, identifier data or OTP storage need not be fixed on manufacture, and instead can be dynamically exposed for selection and re-configuration (e.g., by way of controller 120) post-fabrication.

In addition to the foregoing, disclosed resistive switching devices have excellent properties for generating identifier data sequences. Such properties include high entropy, which is suitable for generating random or substantially random numbers, low BER, inherent difficulty in reverse engineering or illicit side-channel data access, and fast sensing times. For example, a bit sequence of 128 or 256 identifier (PUF) bits can be formed from 128 or 256 resistive switching devices (as described herein) or 128/256 groups of multiple such resistive switching devices (as described in differential identifier bit generation; see FIGS. 5 and 6, infra). High randomness in generating identifier bits minimizes nonrandom patterns between bits (resistive switching devices/groups of such devices) of a sequence, mitigating or avoiding false rejection rates. In addition, high randomness enhances security margin by minimizing hamming distance values for multiple read operations of an identifier sequence on a single die and providing an ideal gaussian distribution of hamming distance values among multiple dies of resistive switching devices. This can increase a total number of semiconductor chips that can achieve distinct identifier sequences for a given sequence bit count, even with high security margin (e.g., defined by a number of distinct bits differentiating different PUF sequences).

In one or more embodiments, controller 120 can be operable to perform memory operations on array of memory 110. For instance, controller 120 can be operable to perform sensing operations pertaining to generating an identifier data bit from one (or a group of) resistive switching device(s) allocated to PUF memory cells 112, in an embodiment(s). Examples of sensing operations pertaining to generating an identifier bit can include: native current (of an un-programmed resistive switching device, also called leak current), native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, as described hereinbelow (or as described within U.S. application Ser. No. 17/223,817 incorporated by reference hereinabove). In other embodiments, controller 120 can be operable to perform a program operation(s) pertaining to generating an identifier data bit from one or more resistive switching devices allocated to PUF memory cells 112, in further embodiments. Examples of such program operations include: a native program voltage (e.g., whether a bit is programmed or not programmed in response to a selected voltage), native program speed (e.g., whether a bit is programmed or not programmed after a selected pulse time), native non-programmed current (e.g., whether a virgin current is above or below a preselected current value), and so forth. In still other embodiments, controller 120 can be configured to implement differential operations pertaining to generating an identifier bit from a plurality of resistive switching devices. Differential operations usable to generate an identifier bit according to aspects of the present disclosure can include: differential program speed, differential native program voltage, differential native (leak) current, differential native electrical resistance, differential on-state resistance, differential erase voltage or current, differential delay frequency, differential parasitic resistance or capacitance, a differential program or erase minimum pulse width, or the like, or a suitable combination of the foregoing.

In yet other embodiments, controller 120 can be operable to selectively implement one-time programmable operations on selected PUF memory cells 112 to render permanent an identifier bit sequence generated with a program event (e.g., native program voltage, native program speed, differential program speed, differential program voltage, etc.). Described differently, a PUF data sequence comprising program and un-programmed bits can be reinforced with a strong program pulse, e.g., a one-time programmable pulse, to make program bits of the PUF data sequence non-erasable and create large sensing margin between the program bits and the un-programmed bits of the PUF data sequence.

In still additional embodiments, controller 120 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on PUF memory cells 112, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a '1' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a '0' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

It should be appreciated that a suitable threshold or set of thresholds can be established for other resistive switching device operational characteristics selected for generating identifier bits information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 120; in other embodiments default threshold settings can be set upon initializing a semiconductor chip.

In further embodiments, an operational characteristic or program event utilized to generate a PUF bit sequence can be selected to have the same or substantially the same measurement over time, over many read cycles and at a range of temperatures common to semiconductor chips. This leads to very low bit error rate for disclosed identifier bit sequences. As an illustrative example, a native leak current (or other physical unclonable characteristic) for a resistive switching device measured for the first time on day 1 at room temperature can measure the same or substantially the same (e.g., relative to a constant native leak current threshold) five years later, at 100 degrees C. after a million read operations. Values of the resistance switching device can be determined upon demand by controller 120. As another illustrative example, to determine an electrical resistance of a resistive switching device, a current source can be applied to the resistive switching device, a voltage drop measured and resistance calculated. Other techniques for measuring or determining physical characteristics of resistive switching devices known in the art or reasonably conveyed to one of ordinary skill in the art are considered within the scope of the present disclosure.

In addition to the foregoing, controller 120 can be configured to define an arrangement or ordering of resistive switching devices (or groups of resistive switching devices) to create a multi-bit sequence of identifier bits. As one illustrative example, resistive switching devices 0:7 can be read and assigned to bits 0:7 of a bit sequence. In other embodiments, the bit sequence need not be derived from resistive switching devices arrayed in a particular order. As an example, from an ordinal line of resistive switching devices, devices 15, 90, 7, 21, 50, 2, 37, 19 can be read and respectively assigned to bits 0:7 of an output bit string. The bit string can be of any selected length. For instance, bit strings of 64 bits, 256 bits, 1024 bits, 64 kbits, or any other suitable subset of PUF memory cells 112 up to all of PUF memory cells 112 (which can include all of array(s) of memory 110 in at least some embodiments) may be employed for a bit string. As another non-limiting illustration, for a 256-bit identifier sequence, controller 120 can define an ordering of PUF memory cells 112/groups of PUF memory cells 112 to correspond with a sequence of 256 bits. Identifier bit values (e.g., logic levels, . . . ) generated from the PUF memory cells 112/groups of PUF memory cells 112 can then be ordered by controller 120 consistent with the device(s) ordering to thereby create the 256-bit identifier sequence. As a specific illustration: where a row of 256 resistive switching devices in an array is selected for generating an identifier sequence, identifier bit values of the 256 resistive switching devices can be arranged in the order the resistive switching devices are physically situated in the row; however, this is an illustrative example only and any other suitable arrangement or ordering can be implemented by controller 120 as an alternative or in addition.

As is evident from the disclosure as a whole, any suitable number of bits can be allocated to identifier bits, and thus controller 120 can be operable to determine which identifier bits from PUF memory cells 112 contribute to identifier data: 64 bits, 1 kbits, 64 kbits or any other suitable subset of array(s) of memory 110 up to and including all of array(s) memory 110. In one or more embodiments, controller 120 can implement methods 800-1000 of FIGS. 8-10 on array(s) of memory 110.

In one or more additional embodiments, controller 120 can be operable to store data in MTP memory cells 116 or OTP memory cells 114. Controller 120 can receive an input data word from input(s) 140 to be stored, as an example. In some embodiments, controller 120 can combine the input data word with an identifier data sequence stored at/generated at PUF memory cells 112 to generate an output data word. This output data word can be stored in MTP memory cells 116. The input word can optionally be deleted. Subsequently, to recreate the input data, the output data word stored in MTP memory cells 116 can be combined with the identifier data sequence (optionally computed on-the-fly by controller 120), and the recreated input data word can be output via output(s) 150. In various embodiments, such an input data word can be a password, a document, a cryptographic key, or any other suitable data to be stored securely.

Figure 2:
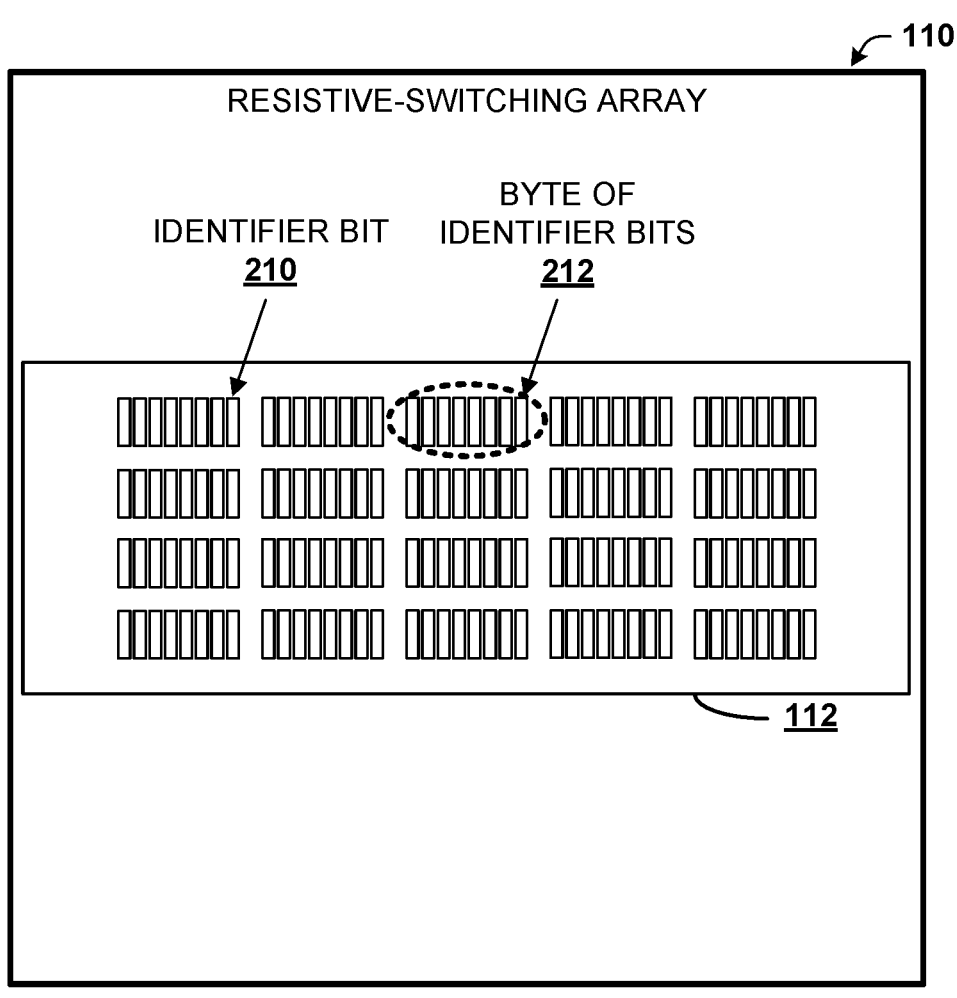
FIG. 2 depicts a diagram of an example arrangement of cells in a resistive memory array for forming a sequence of resistive memory identifier data, in an embodiment.

FIG. 2 depicts an example arrangement of PUF memory cells 112 of array(s) of memory cells 110, in one or more embodiments. PUF memory cells 112 are depicted by blocks representing individual identifier bits 210 and are grouped into bytes of identifier bits, including byte of identifier bits 212. Suitable numbers of identifier bits 210 (e.g., 64 bits, 128 bits, 256 bits, 512 bits, 1024 bits, and so forth, or any suitable value there between) can be aggregated to form an identifier sequence, such as a cryptographic key, a unique ID for a chip, electronic device, or the like, or other suitable identifier sequence. The identifier sequence can be stored on contiguous bits of PUF memory cells 112 within the array(s) of memory cells 110 in some disclosed embodiments, or non-contiguous bits in other embodiments. In further embodiments, the identifier sequence can be contained within a single row or column of PUF memory cells 112, or can be spread across multiple rows, multiple columns or across multiple rows and multiple columns of PUF memory cells 112.

In the embodiment illustrated by FIG. 2, PUF memory cells 112 do not illustrate correction bits (e.g., parity bits, . . . ) within PUF memory cells 112. However, according to various embodiments correction bits associated with an identifier sequence can also be saved to PUF memory cells 112. The correction bits can be adjacent to the identifier sequence, appended to bits within a row following the identifier sequence, appended to bits within a row before the identifier sequence, and so forth. In additional embodiments, correction bits for an identifier sequence can be stored in respective portions that are adjacent to an associated byte of the identifier sequence (e.g., see FIGS. 3, 4 and 7, infra).

Figure 2A:
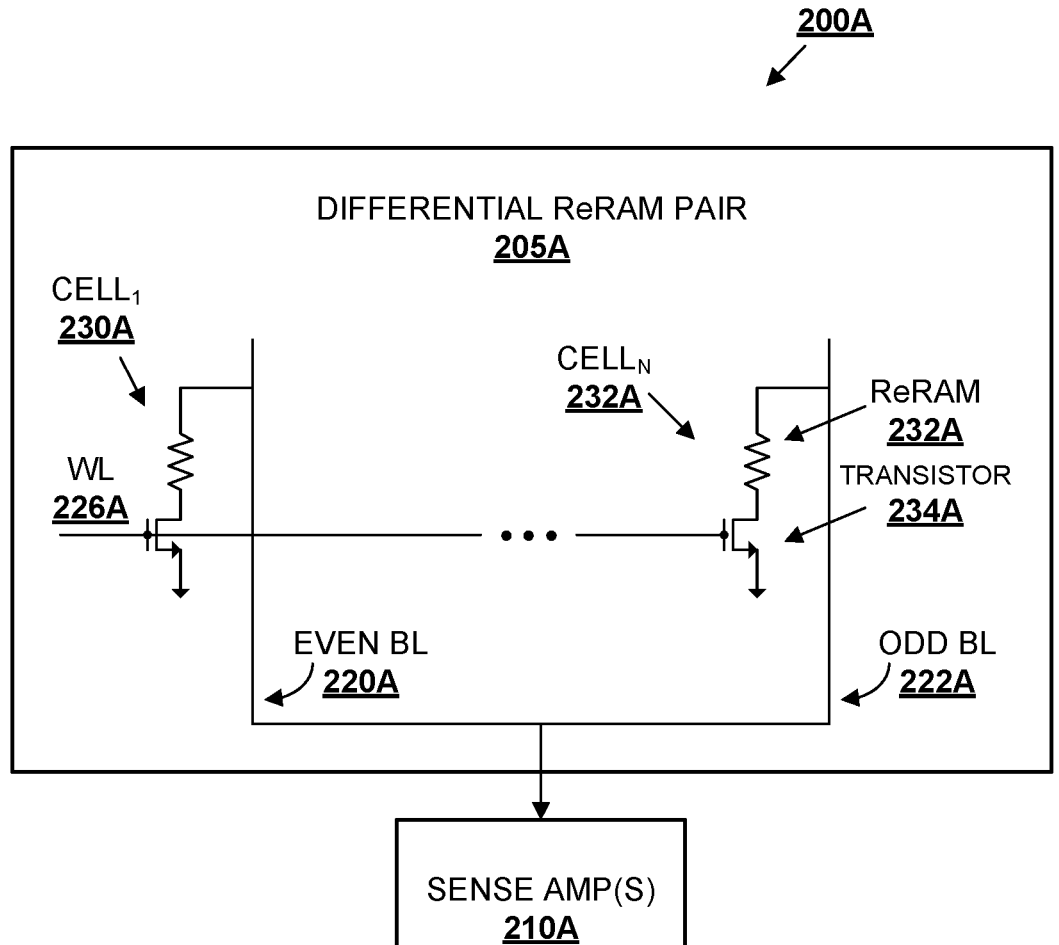
FIG. 2A illustrates a schematic diagram of an example differential bit defined by a pair of memory cells, in one or more embodiments.

FIG. 2A illustrates a block diagram of an example differential PUF circuit 200A according to additional embodiments of the present disclosure. In the embodiment depicted by FIG. 2A, differential PUF circuit 200A includes a differential resistive switching device pair 205A having outputs connected to a sense amp(s) 210A. In other embodiments, larger numbers of differential switching devices can be aggregated to define a PUF bit instead.

In general, a differential PUF bit aggregates two or more resistive switching devices and digitizes the 'bit' based on relative responses of the aggregated devices to a PUF program event. As described herein, PUF program events can include many types of program signals to induce suitable responses in resistive switching devices. Rules stored by an integrated circuit device (e.g., in trim settings stored by controller 120) can define how relative responses of devices that define a PUF bit to a PUF program event can establish a digital value for the PUF bit. As one illustrative example, in response to a PUF program event that asserts a sub-program voltage to two (or more) native resistive switching devices (having never been previously programmed) can measure a native leak current of the devices. In response to the first switching device satisfying a predetermined condition a first digital value (e.g., a '0') can be assigned to the PUF bit, whereas a native leak current of the second switching devices satisfying the predetermined condition can assign a second digital value (e.g., a '1') for the PUF bit. The predetermined condition can be any suitable comparison of switching device responses to themselves or to a fixed value or measurement. As a specific example, the predetermined condition can include: a native current higher than or lower than a threshold, a native current of the first device being higher than/lower than the second device, or the like, in the example of a PUF program event utilizing a sub-program voltage. Other suitable PUF program events described herein or reasonably conveyed to one of skill in the art by way of the context provided herein can be utilized for differential PUF programming, assuming rules for digitizing relative PUF programming response results of multiple bits can be suitably established, such as the examples given herein.

Differential pair 205A includes a first resistive switching cell, $cell_1$ 230A and a second resistive switching cell, $cell_N$ 232A (referred to collectively as cells 230A, 232A, and where N is a positive integer greater than 1). Cells 230A, 232A are one transistor, one resistor (1T1R) resistive switching cells, each comprising a ReRAM 232A and transistor 234A in electrical series combination. An even bitline 220A in an array is provided connected to $cell_1$ 230A, and an odd bitline 222A in the array is provided connected to $cell_N$ 232A. A wordline 226A is connected to gate nodes of the transistors 234A of cells 230A, 232A. When wordline 226A is activated and a PUF program signal applied to even bitline 220A or odd bitline 222A (or both), a response signal(s) is produced on a bitline(s) 220A, 222A that can be measured at sense amp(s) 210A.

Figure 2B:
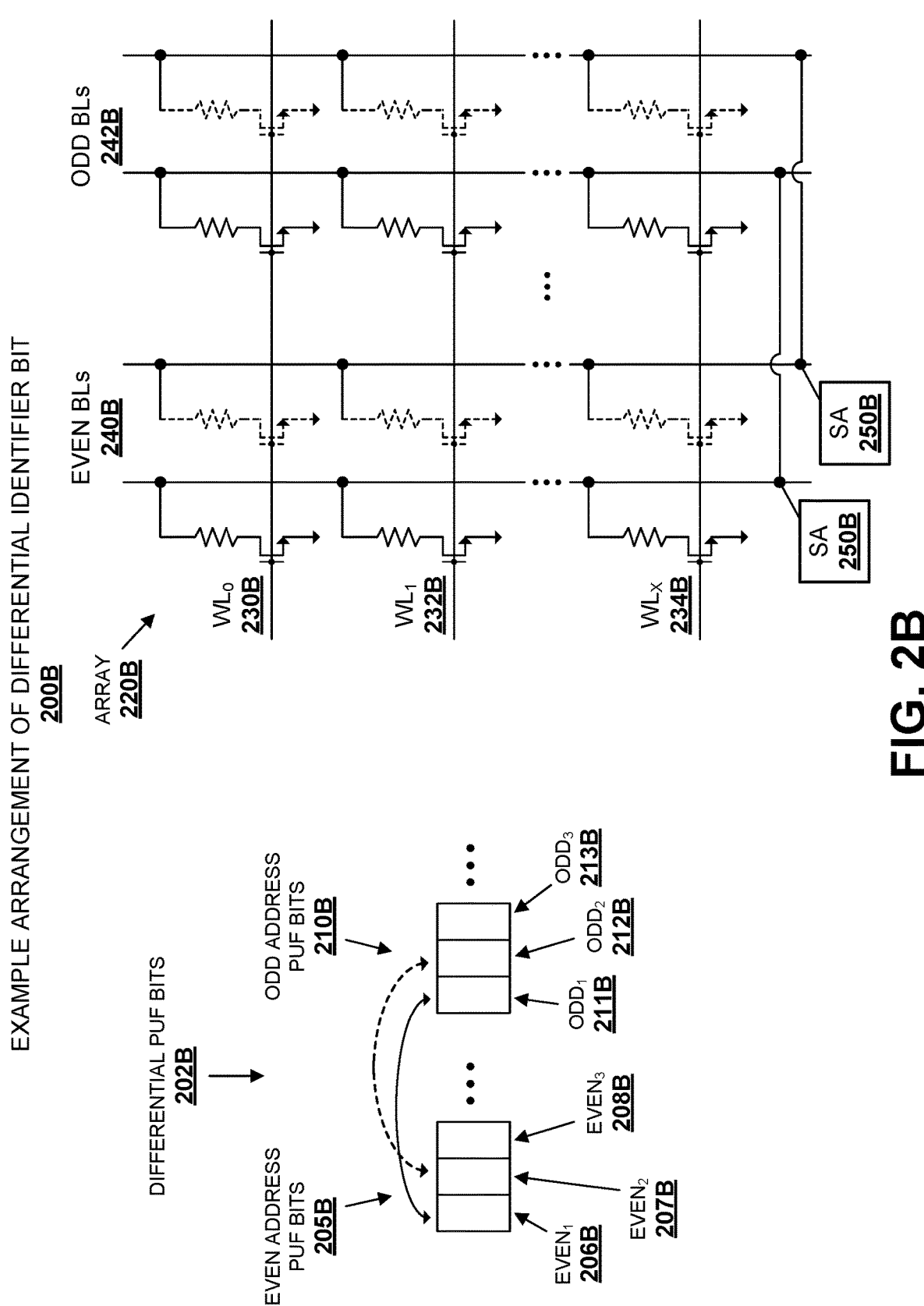
FIG. 2B depicts an example arrangement of differential bits defined by multiple memory cells in an array of such memory cells, according to further embodiments.
Figure 2C:
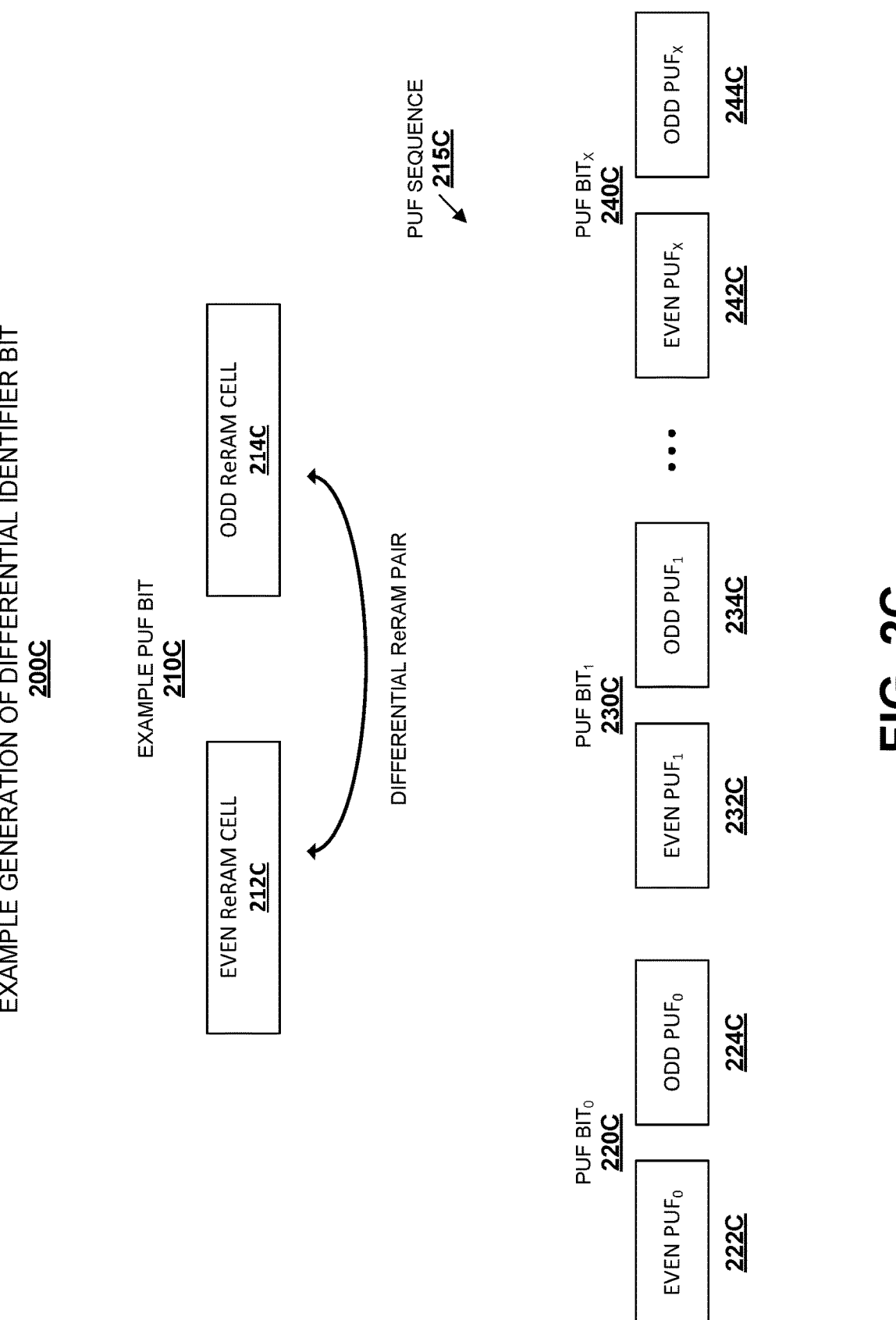
FIG. 2C illustrates a sample data sequence generated from differential bits defined by respective pairs of memory cells, in still further embodiments.

In one or more embodiments, differential PUF bits can be defined by aggregating multiple resistive switching devices, including: one cell on an even bitline of an array with a second cell on an odd bitline of the array (e.g., see FIGS. 2B and 2C, infra). Although even and odd bitlines provide a convenient example to define what cells to aggregate in defining a PUF bit, the subject disclosure is not so limited and cells on different even bitlines or cells on different odd bitlines can be aggregated in other embodiments. Further, in some embodiments, a PUF bit can be defined by a group of cells on adjacent odd and even bitlines, whereas in other embodiments the PUF bit can be defined by a group of cells on non-adjacent odd and even bitlines (or non-adjacent odd bitlines, or non-adjacent even bitlines). In additional embodiments, a group of memory devices defining a differential PUF bit can include more than two memory cells. In some such embodiments, a PUF bit can be defined by: four memory cells, eight memory cells, and so on.

FIG. 2B illustrates a diagram of an example arrangement 200B of differential identifier bits according to alternative or additional embodiments of the present disclosure. Differential identifier bits can be utilized for generating PUF data or for generating RNG data, in various embodiments. On the left-side of FIG. 2B is an illustration of example differential PUF bits 202B (also applicable to RNG bits). Even address portions 205B of the PUF bits 202B and odd address portions 210B of the PUF bits 202B are shown. Although illustrated as blocks, the blocks of even and odd address portions 205B, 210B represent respective resistive switching cells of an array of resistive switching devices 220B. The respective resistive switching cells can be the same or similar to cells 230A, 232A of FIG. 2A in some embodiments, whereas in other embodiments a resistive switching cell can have other arrangements of a resistive switching device and one or more transistors, as well as one or more other analog or digital circuit components suitable for a resistive switching cell known in the art or reasonably conveyed to one of ordinary skill in the art by way of the context presented herein, all of which are considered within the scope of the present disclosure.

Differential PUF bits 202B illustrate three PUF bits and respective even and odd memory cells forming the PUF bits. Even $cell_1$ 206B and odd $cell_1$ 211B form a first PUF bit, even $cell_2$ 207B and odd $cell_2$ 212B form a second PUF bit, and even $cell_3$ 208B and odd $cell_3$ 213B form a third PUF bit. Array 220B illustrates an arrangement of wordlines and bitlines defining an array of multiple resistive switching cells according to some disclosed embodiments. Two pairs of differential PUF bits 202B can be defined on each wordline depicted by array 220B, but it should be understood that many more pairs of differential PUF bits 202B can be defined in an array that is not limited by drawing area constraints, as one of skill in the art would readily understand.

The wordlines include $wordline_0$ 230B, $wordline_1$ 232B through $wordline_x$ 234B, where x is a suitable integer larger than 1, referred to collectively as wordlines 230B-234B. Likewise, the bitlines include even bitlines 240B and odd bitlines 242B. A differential PUF bit 202 can be defined at a wordline and include a memory cell (e.g., $even_1$ 206B) connected to one bitline of even bitlines 240B and a second memory cell (e.g., $odd_1$ 211B) connected to one bitline of odd bitlines 242B. A second differential PUF bit 202B, can be defined by even and odd memory cells (e.g., $even_2$ 207B and $odd_2$ 212B) on the same wordline (e.g., $wordline_0$ 230B) adjacent to the memory cell and second memory cell, in an embodiment(s). In alternative embodiments, the second differential PUF bit 202B can be defined by memory cells that are on non-adjacent bitlines with respect to the memory cell and second memory cell, while still on the same wordline. In still other embodiments, the second differential PUF bit 202B can be defined by even and odd memory cells on a different wordline (e.g., $wordline_1$ 232B). Moreover, any plurality of the PUF bit, second PUF bit, a third PUF bit (e.g., defined by $even_3$ 208B and $odd_3$ 213B), or other PUF bits not depicted can form a PUF data sequence (or portion thereof) when on the same wordline in either adjacent or non-adjacent bitlines, or on different wordlines in adjacent or non-adjacent bitlines, or suitable combinations of the foregoing. Where PUF bits of a data sequence reside on different wordlines, suitable inhibition circuitry or signal processes can be provided for array 220B to mitigate or avoid bit disturb effects on memory cells not associated with the data sequence, or PUF bits on a subset of bitlines or wordlines can be operated upon sequentially while inhibiting other portions of the bitlines and wordlines connected to one or more PUF bits, or a suitable combination of the foregoing.

FIG. 2C illustrates an example of a differential identifier bit 200C, in various embodiments. Differential identifier bit 200C can be a PUF bit in some embodiments (e.g., when the PUF bit is defined by native, never-programmed resistive switching devices) or can be a RNG bit in other embodiments (e.g., when the PUF bit is defined by native or non-native resistive switching devices, and where the switching devices are previously programmed, having a same or near-same program cycle count, in at least one embodiment). The following description will be directed to PUF identifier bits but can be applicable to RNG identifier bits as well.

A differential PUF bit 200C comprises a group of memory cells, including a memory cell at an even bitline (an even cell) and a memory cell at an odd bitline (an odd cell). The grouping to define the differential PUF bit 200C can be through tying their respective even and odd bitlines to a shared sense amp (e.g., see FIGS. 2A and 2B, supra). In response to receipt of a PUF write operation (e.g., from a host device 260C), a suitable PUF program event is applied to both the even cell and the odd cell to generate a data value for the differential PUF bit 200C. The program event can be accompanied by all '1's with or within a host command as the 'data' to implement the PUF write, or a controller will set the data to '1's in response to receiving the host command specifying (or implying) the PUF write.

In response to the PUF write, assuming the binary digital context, the even cell or odd cell will satisfy a PUF write criterion associated with a digital '1'. For example, the even cell or the odd cell will become programmed in response to the PUF program event, and depending on which is programmed the PUF bit will have either a '1' value or a '0' value. Rules for defining digitization of the PUF bit value can determine whether the even cell or odd cell has a state matching the PUF bit value, and therefore which cell contains the value of the PUF bit. As an illustrative example, where digitization rules define a PUF bit of '0' when the even cell is programmed to a low resistance state (e.g., conventionally corresponding to a digital '1' value) and a PUF bit of '1' when the odd cell is programmed to the low resistance state (e.g., the conventional '1'), the rules establish the odd cell as matching the digital value of the PUF bit and the even cell matching an inverse of the PUF bit. Conversely, where alternative rules define a PUF bit of '1' when the even cell is programmed and a PUF bit value of '0' when the odd cell is programmed, the even cells will contain the PUF bit value and the odd cells will contain the inverse of the PUF bit value.

FIG. 2C also depicts an x-bit PUF data sequence 215C, where x can be any suitable integer greater than 0. To generate a PUF key for cryptographic purposes, for example, x can be 128 bits, 256 bits, 512 bits, 1024 bits, and so forth or any suitable value or range there between in various embodiments. The x-bit PUF data sequence can produce x bits of highly non-correlated data by leveraging inherent stochastic characteristics of native resistive switching devices. For instance, measurable responses to program events that depend upon the stochastic characteristics of the resistive switching devices will be non-correlated, and when digitized produce the non-correlated data. Selecting a suitable number of PUF bits to generate the needed number of data bits will therefore produce a PUF cryptographic key having excellent randomness between bits of the key, between different keys, and so forth.

PUF data sequence 215C includes a zeroth PUF $bit_0$ 220C, a first PUF $bit_1$ 230C through an $x^{th}$ PUF bit. 240C (referred to collectively as PUF bits 220C-240C). The PUF bits 220C-240C can be embodied by groups of differential memory cells as illustrated by FIGS. 2B and 2C, though PUF bits 220C-240C can use non differential PUF data generation techniques using only a single resistive switching device per PUF bit as described herein as well. Utilizing pairs of memory cells to create a differential PUF bit sequence, PUF $bit_0$ 220C can comprise even PUF $cell_0$ 222C and odd PUF $cell_0$ 224C, PUF $bit_1$ 230C can comprise even PUF $cell_1$ 232C and odd PUF $cell_1$ 234C and PUF $bit_x$ 240C can comprise even PUF $cell_x$ 242C and odd PUF $cell_x$ 244C. Upon generating PUF data in each of PUF bits 220C-240C, the PUF data will be stored in either the even PUF cells or the odd PUF cells (with the inverse of the PUF data being stored in the odd or even, respectively), depending on the digitization rules utilized for PUF sequence 215C (e.g., stored in trim settings of controller 120 or any other suitable non-volatile memory of an integrated circuit device) containing the resistive switching devices of PUF sequence 215C.

Figure 3:
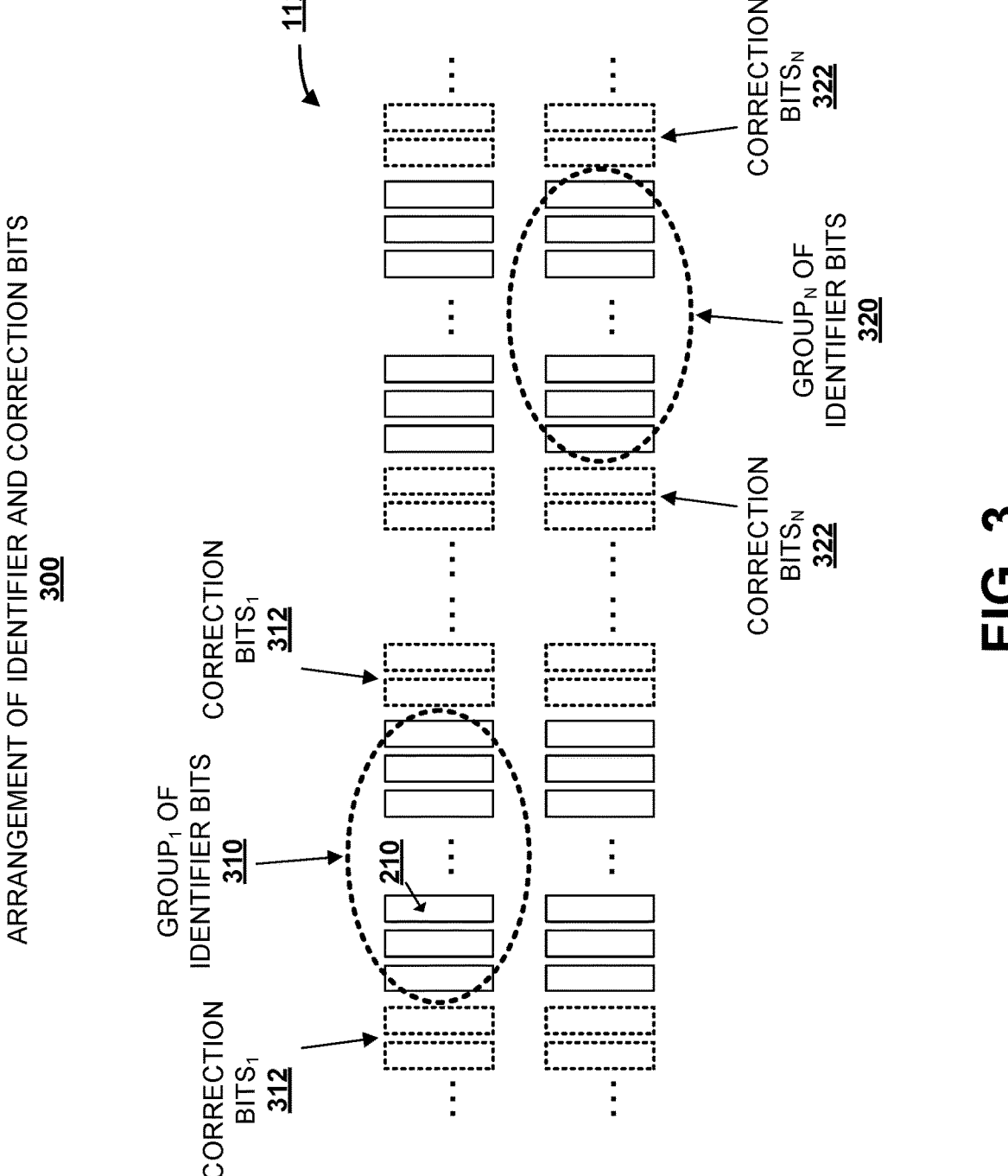
FIG. 3 illustrates a diagram of a sample arrangement of cells in a resistive memory array including identifier data and correction bits, in further embodiments.

FIG. 3 illustrates an instance of an arrangement 300 of identifier bits and correction bits within an array of resistive switching memory cells (e.g., PUF memory cells 112) according to alternative or additional embodiments of the present disclosure. Arrangement 300 illustrates a first group of identifier bits, identifier $bits_1$ 310, having associated correction $bits_1$ 312 pertaining to data stored at the identifier $bits_1$ 310. The array of resistive switching memory cells can include additional groups of identifier bits, for example an Nth group of identifier bits: identifier $bits_N$ 320, where N can be a suitable positive integer. A set of correction $bits_N$ 322 associated with data stored at identifier $bits_N$ 320 are also provided for the identifier $bits_N$ 320, as illustrated.

In one embodiment(s), identifier $bits_1$ 310 and identifier $bits_N$ 320 can be part of an identifier sequence (e.g., a PUF sequence, a random number sequence, a unique identifier sequence, and so forth) stored at the array of resistive switching memory cells, as described herein. In other embodiments, identifier $bits_1$ 310 can be part of a first identifier sequence (e.g., stored at a first row of the array of resistive switching memory cells, or portion thereof) and identifier $bits_N$ 320 can be part of a second identifier sequence (e.g., stored at a second row of the array of resistive switching memory cells, or portion thereof).

It should be appreciated that neither identifier $bits_1$ 310, identifier $bits_N$ 320, correction $bits_1$ 312 nor correction $bits_N$ 322 are limited by the number of bits depicted. For instance, while in some embodiments, identifier $bits_1$ 310 (or identifier $bits_N$ 320) can be a byte of data, the subject disclosure is not so limited and identifier $bits_1$ 310 (or identifier $bits_N$ 320) can comprise more or fewer than a byte of bits, and more or fewer than the depicted number of bits. Likewise, while correction $bits_1$ 312 and correction $bits_N$ 322 illustrate a given number of bits associated with identifier $bits_1$ 310 and identifier $bits_N$ 320, respectively, the subject disclosure is not limited to this number of correction bits and more or fewer correction bits can be provided for identifier $bits_1$ 310 and identifier $bits_N$ 320. For instance, the number of correction bits can depend upon a correction algorithm employed by correction code encoder 122 and a selected error bit correction capacity (e.g., a maximum number of bit errors that can be corrected by the number of correction bits) for an associated group of identifier bits, 310, 320. The correction algorithm or selected error bit correction capacity can be selected at controller 120, in at least some disclosed embodiments.

As illustrated by FIG. 3, correction bits associated with a group of identifier bits can be in part appended before the group of identifier bits (within a given row) and in part appended following the group of identifier bits. As an illustrative example, correction $bits_1$ 312 can be in part before identifier $bits_1$ 310 (to the left of the first group of identifier bits as oriented in the illustration) and correction $bits_1$ 312 can be in second part behind identifier $bits_1$ 310 (to the right of the first group of identifier bits). Likewise, correction $bits_N$ 322 can be in part before identifier $bits_N$ 320 and in part behind identifier $bits_N$ 320. Other arrangements of correction bits and identifier bits known in the art or reasonably conveyed to one of ordinary skill in the art by way of the context provided herein are considered within the scope of the present disclosure (e.g., see FIGS. 4 and 7, infra).

Figure 4:
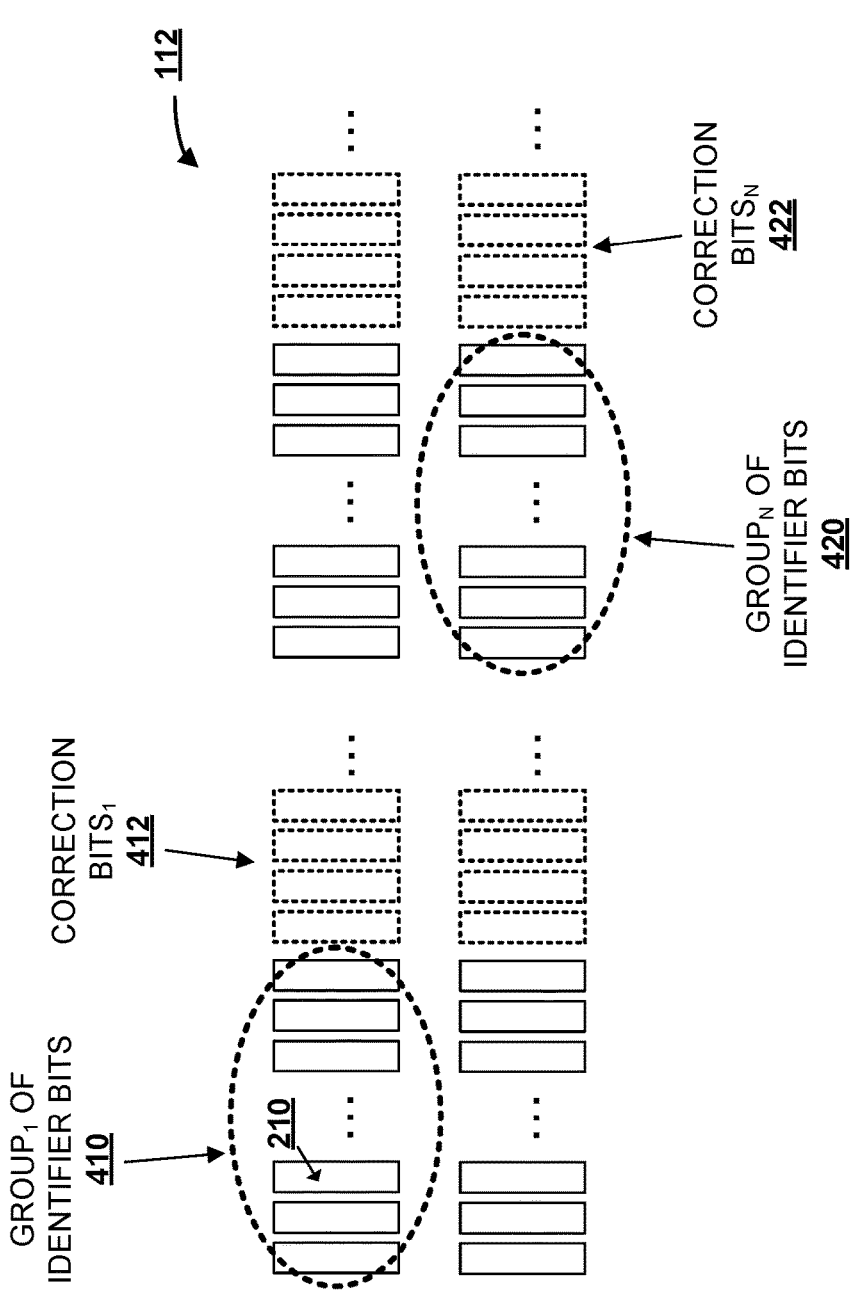
FIG. 4 depicts a diagram of a sample arrangement of cells in a resistive memory array including identifier and correction bits according to an alternative embodiment.

FIG. 4 depicts an example arrangement 400 of identifier bits and correction bits according to alternative or additional embodiments of the present disclosure. Arrangement 400 of identifier bits and correction bits includes a first group of identifiers $bits_1$ 410 through an Nth group of identifier $bits_N$ 420, where N is a suitable positive integer. In the embodiment(s) depicted by arrangement 400 of identifier and correction bits, respective sets of correction bits are appended following their associated identifier bits in a row of an array of resistive switching memory cells (e.g., PUF memory cells 112). Thus, correction $bits_1$ 412 follow identifier $bits_1$ 410 and correction bits 422 follow identifier $bits_N$ 420 in respective rows of the array. In other embodiments— not depicted—correction $bits_1$ 412 can precede identifier $bits_1$ 410, or correction $bits_N$ 422 can precede identifier $bits_N$ 420 in their respective rows, or both. In still other embodiments, other arrangements of correction bits and identifier bits can be implemented.

FIG. 5 illustrates an example schematic diagram of an array 500 of resistive switching memory cells, in additional embodiments of the present disclosure. The array includes a differential resistive switching bit definition that correlates a plurality (e.g., two, three, four, . . . ) of one-transistor 514 and one-resistor 512 (1T1R) circuits with a single PUF bit. A sequence of PUF data can be generated from multiples of the pluralities of the 1T1R circuits. Array 500 illustrates one example spatial arrangement of 1T1R circuits in which two (or more) 1T1R circuits in a column of array 500 located on different wordlines of array 500. Other example spatial arrangements of 1T1R circuits for defining a PUF bit disclosed herein (e.g., see FIG. 6, infra) or reasonably conveyed to one of ordinary skill in the art are considered within the scope of the present disclosure. As non-limiting examples, memory circuits on adjacent wordlines can be defined as a PUF bit, memory circuits on adjacent bitlines can be defined as a PUF bit, memory circuits on non-adjacent wordlines can be defined as a PUF bit, memory circuits on non-adjacent bitlines can be defined as a PUF bit (e.g., see FIG. 6, infra), memory circuits on non-adjacent wordlines and non-adjacent bitlines can be defined as a PUF bit, or any suitable combination of the foregoing.

Array 500 includes a set of wordlines, including wordline $WL_{<0>}$ 520 through $WL_{<N>}$ 522 (referred to herein collectively as wordlines 520-522), where N is a suitable positive integer greater than 1. Additionally, array 500 includes a set of bitlines, including bitlines: $BL_{<0>}$ 530, $BL_{<1>}$ 532, $BL_{<2>}$ 534, $BL_{<3>}$ 535 through $BL_{<X-1>}$ 536 and $BL_{<X>}$ 538 (referred to herein collectively as bitlines 530-538). Respective bitlines 530-538 are connected to first terminals of 1T1R circuits on wordlines 520-522, and a set of sourcelines including sourcelines: $SL_{<0>}$ 540, $SL_{<1>}$ 542, $SL_{<2>}$ 544, $SL_{<3>}$ 545, through $SL_{<X-1>}$ 546 and $SL_{<X>}$ 548 (referred to herein collectively as bitlines 540-548) are respectively connected to second terminals of the 1T1R circuits.

A differential PUF bit such as identifier $bit_1$ 502 can be programmed by a relative process affecting 1T1R circuits comprising the differential PUF bit. A relative process can be a memory process applied to the plurality of 1T1R circuits. The differential PUF bit can be assigned a '0' or '1' digital value based on a result of the relative process. To illustrate, an example relative memory process can be a program voltage applied to a pair of 1T1R circuits; if a first of the 1T1R circuits is the first to become programmed in response to the program voltage, the differential PUF bit can be assigned a first digital value (e.g., a '0') and if a second of the 1T1R circuits is the first to become programmed in response to the program voltage, the differential PUF bit can be assigned a second digital value (e.g., a '1'). When applied to multiple PUF bits a PUF data sequence can be generated. Optionally, 1T1R circuits having been programmed in response to the relative process can be reinforced with a strong write pulse (optionally a one-time programmable pulse) to increase sensing margin between PUF bits having the '0' value and PUF bits having the '1' value.

Figure 6:
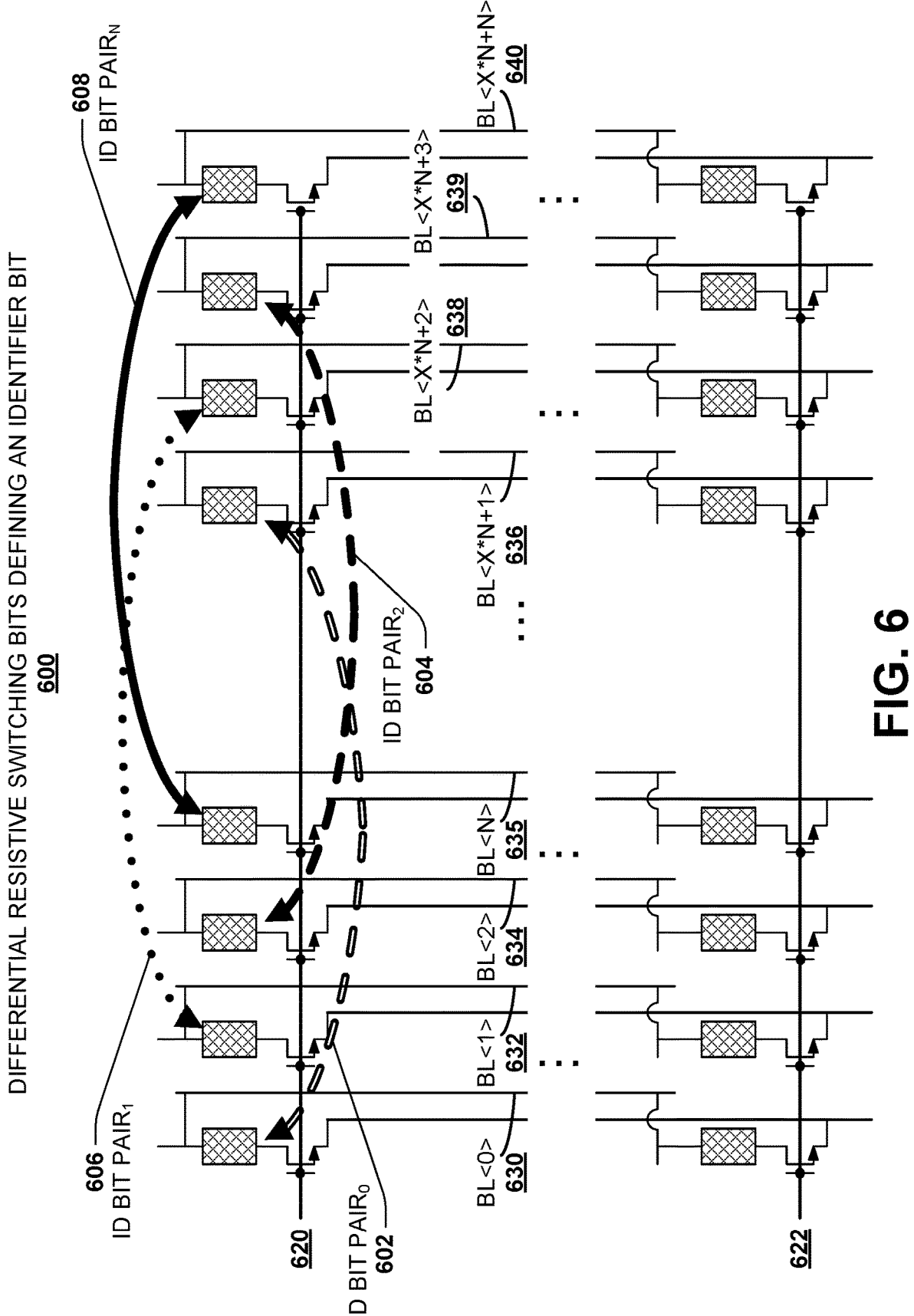
FIG. 6 depicts a schematic diagram of another arrangement of multiple resistive memory cells to define an identifier bit in still further embodiments.

FIG. 6 illustrates an example schematic diagram of an array 600 of resistive switching memory cells, in additional embodiments of the present disclosure. The array includes a differential resistive switching bit definition that correlates a plurality (e.g., two, three, four, . . . ) of 1T1R circuits with a single PUF bit. A sequence of PUF data can be generated from multiples of the pluralities of the 1T1R circuits, similar to array 500 of FIG. 5, above. Array 600 illustrates another example spatial arrangement of 1T1R circuits in which two (or more) 1T1R circuits along a row of array 600 (and, e.g., located on different bitlines of array 600) define respective PUF bits 602-608.

Array 600 is structured with wordlines 620, 622 intersecting bitlines $BL_{<0>}$ 630, $BL_{<1>}$ 632, $BL_{<2>}$ 634, $BL_{<N>}$ 635 . . . $BL_{<X*N+1>}$ 636, $BL_{<X*N+2>}$ 638, $BL_{<X*N+3>}$ 639, $BL_{<X*N+N>}$ 640 (referred to collectively as bitlines 630-640). N is a number of bits in a PUF data sequence. In various embodiments, N can be any suitable number greater than 1. However, common numbers will be those suitable for applications described herein, such as cryptographic keys, unique identifiers, random numbers, and so forth. Example numbers for N in cryptographic key applications can include 128, 256, 512, etc., depending on a number of bits utilized for the cryptographic key. X is a multiple of the number of bits N in the PUF data sequence that separate respective 1T1R memory circuits defined for a PUF bit on a row of array 600 (e.g., row/wordline 620). Thus, where X is 1, respective 1T1R memory circuits in a given PUF bit are separated by N*1=N memory circuits, specifically the remaining bits in the PUF data sequence. Described differently, for a PUF data sequence of N bits and with two 1T1R memory circuits per PUF bit, there are 2*N such memory circuits. The first N memory circuits on a wordline (e.g., wordline 620) can comprise respective first memory circuits of the N PUF bits, and the subsequent N+1 through 2*N bits (where X is 1) can comprise respective second memory circuits of the N PUF bits. In this example then the 1T1R memory circuits of a given PUF bit are separated by X*N bitlines on a wordline 620.

Thus, as illustrated in FIG. 6, a first PUF bit pair, bit $pair_0$ 602 comprises a memory circuit at $BL_{<0>}$ 630 and a memory circuit at $BL_{<X*N+1>}$ 636, a second PUF bit pair, bit $pair_1$ 606 comprises a memory circuit at $BL_{<1>}$ 632 and a memory circuit at $BL_{<X*N+2>}$ 638, a third PUF bit pair, bit $pair_2$ 604 comprises memory circuits at $BL_{<2>}$ 634 and at $BL_{<X*N+3>}$ 639, and an $N^{th}$ PUF bit pair, bit $pair_N$ 608 comprises memory circuits at $BL_{<N>}$ 635 and at $BL_{<X*N+N>}$ 640. Continuing the example where X is =1, bit $pair_0$ 602 includes a memory circuit on each of bitlines $BL_{<0>}$ 630 and $BL_{<N+1>}$ 636, bit pain 606 includes a memory circuit on each of bitlines $BL_{<1>}$ 632 and $BL_{<N+2>}$ 638, and so on. In other examples, where X is larger than 1, the respective second memory circuits of the N PUF bits are located at positions X*N+1 through X*N+N (e.g., see FIG. 7A infra).

Figure 7:
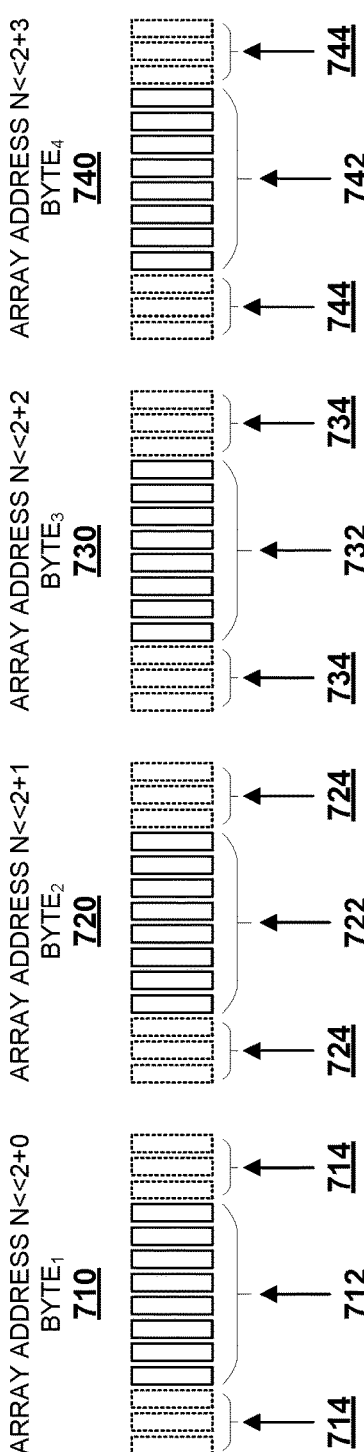
FIGS. 7 and 7A depict an arrangement of data and correction bits within a memory array to implement a 32-bit identifier write with correction, in an embodiment(s)

FIG. 7 illustrates a diagram of an example differential PUF 'write' 700 including error correction code (ECC) parity bits, according to one of more embodiments of the present disclosure. Note that a PUF write is not a traditional digital write operation in which data is received by a memory controller (e.g., controller 120) and written as-received to an address of a memory array. Rather, the differential PUF 'write' 700 engages memory cells at the address to generate PUF data bits. Moreover, because the write is differential, each PUF bit will have one or more additional memory bits associated there with, located elsewhere in the array (e.g., as described at FIGS. 5 and 6, supra; see also FIG. 7A, infra).

The PUF write illustrated in FIG. 7 uses a 4-byte address within an array for generating a 4-byte PUF data sequence. PUF data bits are illustrated in FIG. 7 with solid line rectangles and adjacent ECC parity bits are illustrated with dotted-line rectangles. A first byte, $byte_1$ 710 located at N<<2+0 includes PUF data 712 of one byte in length, and associated ECC parity bits 714, having a first portion appended before PUF data 712 and a second portion appended behind PUF data 712. A second, third and fourth bytes: $byte_2$ 720, $byte_3$ 730, $byte_4$ 740 are similarly situated with respective ECC parity bits 724, 734, 744 in part appended before and in second part appended after their associated PUF data 722, 732, 742.

Upon receiving a PUF data write, such as illustrated in FIG. 7, a controller 120 (or correction code encoder 122) can determine a correction algorithm to be utilized for generating the ECC parity bits, and as a result determine a number of ECC bits required for each byte of PUF data. Controller 120 can then manage the addresses of the PUF data bits to make space within an array for the ECC parity bits. Thus, while a total of 56 bits are utilized for the 4-byte PUF data write of FIG. 7 (32 PUF bits and 24 parity bits), the address space provided by controller 120 for the array and made available external to the array can be limited to the 32 PUF bits.

Figure 7A:
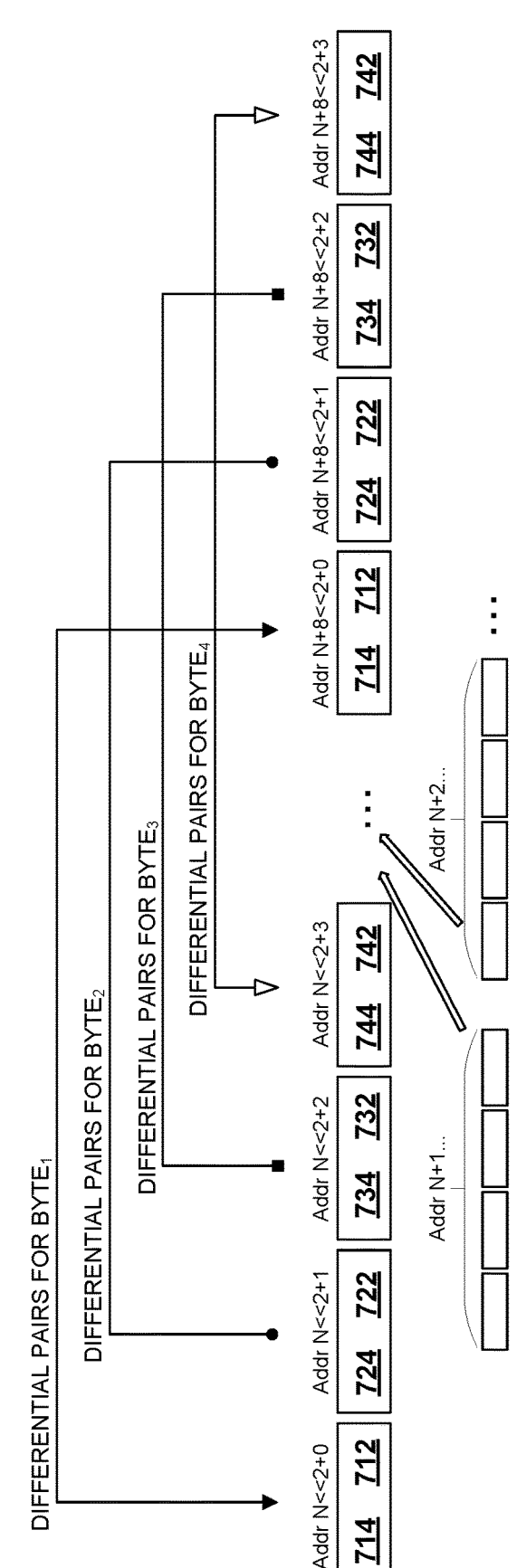

FIG. 7A illustrates an example differential PUF write 700A with ECC parity bits according to additional embodiments of the present disclosure. Differential PUF write 700A depicts the differential bits utilized to form the 4-byte PUF data sequence of FIG. 7. The number of bits needed for each PUF data sequence=number of PUF bits+number of ECC parity bits. However, since the PUF bits are formed with a differential forming process each PUF bit has an associated bit elsewhere in the array (on the same row, on the same column, on different row/column, etc.). In the embodiment depicted by FIG. 7A, differential bits are separated from their differential pair by 8 PUF data sequence (PUF bits+ ECC parity bits). Thus, $byte_1$ with PUF bits 714 and ECC bits 712 at address N has a differential PUF pair at address N+8. This is true for $byte_2$, $byte_3$ and $byte_4$ as well, as indicated. Note that the differential PUF pairs at address N+8 also have associated ECC parity bits (714, 724, 734, 744) to simplify the mapping of differential PUF pair to differential PUF bit, although this is not essential and other embodiments can avoid the parity bits amongst the differential pairs (address N+8 bits).

Once the differential PUF data sequence is formed within the PUF bits of address N and the differential pair bits of address N+8, correction code encoder 122 can read the PUF data sequence. Optionally, controller 120 can reinforce PUF bits with a value of '1', by instituting a strong write pulse or instituting a one-time programmable pulse. After reading the PUF data correction code encoder 122 generates the parity bits associated with the newly generated PUF data sequence. The parity bit values are then written to parity bit locations 714, 724, 734, 744 of each byte in the address N portion of the array.

The diagrams included herein are described with respect to several components, layers and materials of a resistive switching device or a die or wafer comprising many resistive switching devices. It should be appreciated that such diagrams can include those components, layers and materials specified therein, some of the specified components/layers/ materials, or additional components/layers/materials not explicitly depicted but known in the art or reasonably conveyed to those of skill in the art by way of the context provided herein. Sub-layers can also be implemented as adjacent other sub-layers within a depicted layer. Further, embodiments within a particular Figure of the present specification can be applied in part or in whole to other embodiments depicted in other Figures, where suitable, and vice versa. As an illustrative example, arrays of resistive switching devices as illustrated in FIGS. 5 and 6 can be included with array(s) of resistive-switching memory cells 110 of FIG. 1, or memory array 1102 of FIG. 11, or volatile memory 1210A or non-volatile memory 1210B of FIG. 12, and so forth. Additionally, it is noted that one or more disclosed processes can be combined into a single process providing aggregate functionality. For instance, a deposition process can comprise an etching process, or vice versa, to facilitate depositing and etching a component of an integrated circuit device by way of a single process. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 8-10. While for purposes of simplicity of explanation, the methods of FIGS. 8-10 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein are also considered within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium, or the like.

Referring now to FIG. 8, there is illustrated a flowchart 800 for an example method of providing error correction capability for PUF data generated with resistive-switching memory, according to one or more embodiments of the present disclosure. At 802, method 800 can comprise identifying a set of resistive memory bits of a resistive memory array to form a data sequence from native physical characteristics of the resistive memory bits. In some embodiments, the set of resistive memory bits can be native memory cells selected for having no previous program event associated with the set of resistive memory bits, although the subject disclosure is not so limited. At 804, method 800 can comprise initiating a formation pulse on the set of resistive memory bits, and at 806, method 800 can comprise terminating the formation pulse in response to detecting a termination condition selected to program a portion (e.g., half, approximately half, a range of about 40% to about 60% of the bits, or other suitable portion) of the set of resistive memory bits.

At 808, method 800 can additionally comprise reading a data pattern created in the set of resistive memory bits in response to the formation pulse. At 810, method 800 can optionally comprise enforcing programming of bits of the data pattern read as programmed bits (e.g., digital '1', low-resistance state memory cells, and so forth). At 812, method 800 can also comprise generating error correction data that corresponds to the data pattern. In one or more embodiments, the error correction data can be error correction code (ECC) data such as ECC parity bits. At 814, method 800 can also comprise writing the error correction data to the resistive memory array.

In at least one embodiment of the present disclosure, the termination condition is selected to achieve low cross-correlation among the portion of bits of the data sequence that are programmed and a second portion of the bits of the data sequence that remain unprogrammed in response to the formation pulse. In other embodiments, bits of the error correction data can be written within the resistive memory array in physical address locations adjacent to the set of resistive memory bits. For instance, in an embodiment(s), method 800 can further comprise: segmenting the data sequence into multiple bytes of the data sequence, generating portions of the error correction data for respective bytes of the multiple bytes of the data sequence, and writing respective portions of the error correction data to physical address locations adjacent to corresponding bytes of the multiple bytes of the data sequence.

In further embodiments, optionally enforcing programming at 810 of method 800 can further comprise identifying the portion of the set of resistive memory bits that are programmed in response to the formation pulse, and applying a strong program pulse to this portion of the set of resistive memory bits following the reading the data pattern. In at least one embodiment, the strong program pulse can be a one-time programmable pulse causing the portion of the set of resistive memory bits to become in a non-erasable program state.

In one or more further embodiments, identifying the set of resistive memory bits can be in response to a host command that specifies an address associated with the set of resistive memory bits within the resistive memory array. The host command can additionally specify a physical unclonable feature (PUF) write command to be performed on the set of resistive memory bits associated with the specified address, in an embodiment(s).

FIG. 9 depicts a flowchart 900 of a sample method for one or more aspects of the present disclosure according to still further embodiments. At 902, method 900 can comprise receiving instruction for identifier data generation for a number, X, of bits. The identifier data can be PUF data, as a particular example, or a unique identifier or a random number in other examples. At 904, method 900 can comprise identifying a starting address, N, within a memory array for the identifier data and identifying an ending address within the memory array for the identifier data. The ending address can include a second number, P, of correction bits. In an embodiment, the second number of correction bits can be determined from the number, X of identifier bits and a correction algorithm utilized for generating the correction bits. In an embodiment, the ending address for the identifier data plus correction bits can be X+P bits beyond starting address, N, within the memory array: or address N+X+P.

At 906, method 900 can comprise identifying a differential bit pair for each of the X bits of the identifier data. At 908, method 900 can comprise electrically coupling respective pairs of bitlines of each differential bit pair, and at 910, method 900 can comprise initiating a gentle formation pulse on the electrically coupled bitlines. At 912, method 900 can comprise terminating the pulse for a bit pair in response to one bit of the pair becoming programmed, and at 914, method 900 can comprise completing the gentle formation pulse after termination of all bit pair pulses.

At 916, method 900 can comprise reading resulting data generated at the N+X addresses of the identifier data. At 918, method 900 can optionally comprise enforcing programming of bits at the N+X addresses that are programmed to '1' or low-resistance states following the formation pulse. AT 920, method 900 can comprise generating correction code bits (e.g., ECC parity bits, or other correction code bits) for the resulting data and at 922, method 900 can comprise writing the correction code bits to the memory array. In at least one embodiment, the correction code bits can be written adjacent to addresses N through N+X in the memory array.

Referring to FIG. 10, there is illustrated a method 1000 for performing a physical unclonable feature (PUF) write process for a memory array, in various embodiments. At 1002, method 1000 can comprise receiving a host instruction to write X bits of PUF data to an address in resistive memory. In at least one embodiment, the address provided with the host instruction can identify a starting position within the memory array that corresponds to a plurality of resistive switching memory cells targeted for the PUF write. At 1004, method 1000 can comprise identifying a number, P, of correction bits required for the X bits of PUF data. At 1006, method 1000 can comprise allocating X+P bits of memory cells for the PUF write. The allocation can begin at the address in resistive memory in an embodiment.

At 1008, method 1000 can comprise allocating X differential bits at a second address in the resistive memory for differential PUF data generation. In at least one embodiment, additional X differential bits at third, fourth, etc. address locations can be allocated for a differential PUF data generation where more than two resistive memory cells are defined for each PUF bit. At 1010, method 1000 can comprise electrically coupling bitlines of respective pairs of bits (or other numbers of multiples of bits) from the first addresses and the second addresses. Each pair of bits can comprise one resistive memory cell from the first addresses and one resistive memory cell from the second addresses (and any third, fourth, etc., addresses, where utilized).

At 1012, method 1000 can comprise initiating a PUF formation pulse at each pair (or other number) of bits at the address and the second address defined for a PUF bit. At 1014, method 1000 can comprise completing the PUF formation pulse in response to a termination condition. In various embodiments, the termination condition can include a specific criterion monitored for each PUF bit. In such embodiments, the PUF formation pulse can be completed for a given PUF bit independent of other PUF bits, in response to detecting the specific criterion for a given PUF bit. The specific criterion can be, for example, a programming event detected for one (or more) of the pair of bits defined for the PUF bit. As a specific example, the termination condition for a pair of resistive memory cells defining one PUF bit can comprise identifying a first program condition among the pair of resistive memory cells defining the one PUF bit, and whether the program condition is of a resistive memory cell from the first addresses (defining the PUF bit to have a first logical value, e.g., a '0') or the program condition is of a resistive memory cell from the second addresses (defining the PUF bit to have a second logical value, e.g., a '1'). In alternative or additional embodiments, the termination condition can optionally comprise a general criterion monitored for all PUF bits, rather than for independent PUF bits. The general criterion can include a duration of the PUF formation pulse, a number of sub-pulses selected for the PUF formation pulse, a peak voltage or current level having been reached for the PUF formation pulse, or the like, or a suitable combination of the foregoing. Once the general criterion is detected, the PUF formation pulse can be terminated for all PUF bits. In some embodiments, however, no general criterion is utilized and the formation pulse is maintained until a program condition is identified for one resistive memory cell of each PUF bit, in which embodiments, method 1000 can further comprise identifying which PUF bits experienced program conditions from memory cells at the first addresses, and which PUF bits experienced program conditions from memory cells at the second addresses.

At 1016, method 1000 can comprise reading a data pattern formed in the X bits of identifier data (e.g., PUF data) at the first addresses in response to the forming pulse. Alternatively, method 1000 can read a (inverse) data pattern formed in the X differential bits at the second address, but generally only the data pattern formed at the first addresses or the (inverse) data pattern formed in the differential bits at the second addresses is read, not both. At 1018, method 1000 can comprise generating correction data for the data pattern. Generating the correction data can further comprise referencing an error correction algorithm stored in a suitable correction code encoder of a suitable memory controller in some disclosed embodiments (e.g., correction code encoder 122 and memory controller 120 of FIG. 1, supra), and generating the correction data according to the data pattern and the error correction algorithm. At 1020, method 1000 can comprise saving the correction data to the P correction bits of the X+P bits allocated from the resistive memory.

In one or more embodiments, method 1000 can further comprise receiving a command from a host device specifying the PUF write process and the first addresses within the resistive switching memory array for writing the PUF data to the resistive switching memory array. In such embodiment(s), initiating the PUF write process is in response to the command from the host device. These embodiments can facilitate exporting some degree of control over PUF data generation to an external device, rather than limiting all PUF data generation to an internal controller. The first addresses specified in the command from the host device can be virtual addresses of resistive switching memory cells, or physical address of the memory cells, depending on implementation, the transparency of the memory array to the host, the host's ability to map physical addresses and ECC parity bits, and so on.

In further embodiments, the second addresses can be displaced within the resistive switching memory array from the first addresses a multiple of the X bits of PUF data. In at least one embodiment, the second addresses can be displaced eight (8) multiples of the X bits of PUF data (e.g., see FIG. 7A, supra in which differential pairs for $byte_1$ begin at address N<<2+0 and at N+8<<2+0, respectively). In still further embodiments, the second addresses can be displaced within the resistive switching memory array from the first addresses a multiple of the X+P bits of PUF data plus correction bits. This can be implemented easily, for instance, where the multiple is 1 and the second addresses immediately follow the X+P bits of PUF data plus correction bits within the array. However, the subject disclosure is not so limited and includes other multiples of X+P bits where intervening X+P bits can be repurposed following PUF data generation described herein. Repurposing can be for OTP data storage, MTP data storage, or additional identifier data storage that does not require native (never-programmed) resistive switching memory cells but could utilize the respective multiples of P correction bits allocated in the multiples of X+P bits. In an embodiment(s), the second addresses are displaced 8 multiples of the X+P bits of PUF data plus the correction bits (e.g., see FIG. 7A as an example of displacing PUF data 712 and ECC data 714 with 8 instances of 4 bytes of PUF data 712, 722, 732, 742 and 8 instances of ECC parity bits 714, 724, 734, 744).

Example Operating Environments

Figure 11:
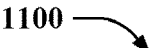
FIG. 11 depicts a block diagram of an example electronic operating environment in accordance with certain embodiments presented herein.

FIG. 11 illustrates a block diagram of an example operating and control environment 1100 for a memory array 1102 of a memory device according to aspects of the subject disclosure. Control environment 1100 and memory array 1102 can be formed within a single semiconductor die in some embodiments, although the subject disclosure is not so limited and in other embodiments some components of control environment 1100 can be formed on a separate semiconductor die. In at least one aspect of the subject disclosure, memory array 1102 can comprise memory selected from a variety of memory cell technologies. In at least one embodiment, memory array 1102 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1106 and sense amps 1108 can be formed adjacent to memory array 1102. Moreover, column controller 1106 can be configured to activate (or identify for activation) a subset of bit lines of memory array 1102. Column controller 1106 can utilize a control signal provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines of memory array 1102. Also utilizing control signals of reference and control signal generator(s) 1118, row controller 1104 can select particular rows of memory cells with a suitable selection voltage. Moreover, row controller 1104 can facilitate program, erase or read operations by applying suitable voltages at selected word lines.

Sense amps 1108 can read data from, or write data to, the activated memory cells of memory array 1102, which are selected by column control 1106 and row control 1104. Data read out from memory array 1102 can be provided to an input/output buffer 1112. Likewise, data to be written to memory array 1102 can be received from the input/output buffer 1112 and written to the activated memory cells of memory array 1102.

A clock source(s) 1110 can provide respective clock pulses to facilitate timing for read, write, and program operations of row controller 1104 and column controller 1106. Clock source(s) 1110 can further facilitate selection of word lines or bit lines in response to external or internal commands received by operating and control environment 1100. Input/output buffer 1112 can comprise a command and address input, as well as a bidirectional data input and output. Instructions are provided over the command and address input, and the data to be written to memory array 1102 as well as data read from memory array 1102 is conveyed on the bidirectional data input and output, facilitating connection to an external host apparatus, such as a computer or other processing device (not depicted, but see e.g., computer 1202 of FIG. 12, infra).

Input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1114. In addition, input data is transmitted to memory array 1102 via signal input lines between sense amps 1108 and input/output buffer 1112, and output data is received from memory array 1102 via signal output lines from sense amps 1108 to input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus and determine whether data input to the input/output buffer 1112 is write data, a command, or an address. Input commands can be transferred to a state machine 1120.

State machine 1120 can be configured to manage programming and reprogramming of memory array 1102 (as well as other memory banks of a multi-bank memory array). Instructions provided to state machine 1120 are implemented according to control logic configurations, enabling state machine 1120 to manage read, write, erase, data input, data output, and other functionality associated with memory cell array 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1110 or reference and control signal generator(s) 1118. Control of clock source(s) 1110 can cause output pulses configured to facilitate row controller 1104 and column controller 1106 implementing the particular functionality. Output pulses can be transferred to selected bit lines by column controller 1106, for instance, or word lines by row controller 1104, for instance.

Figure 12:
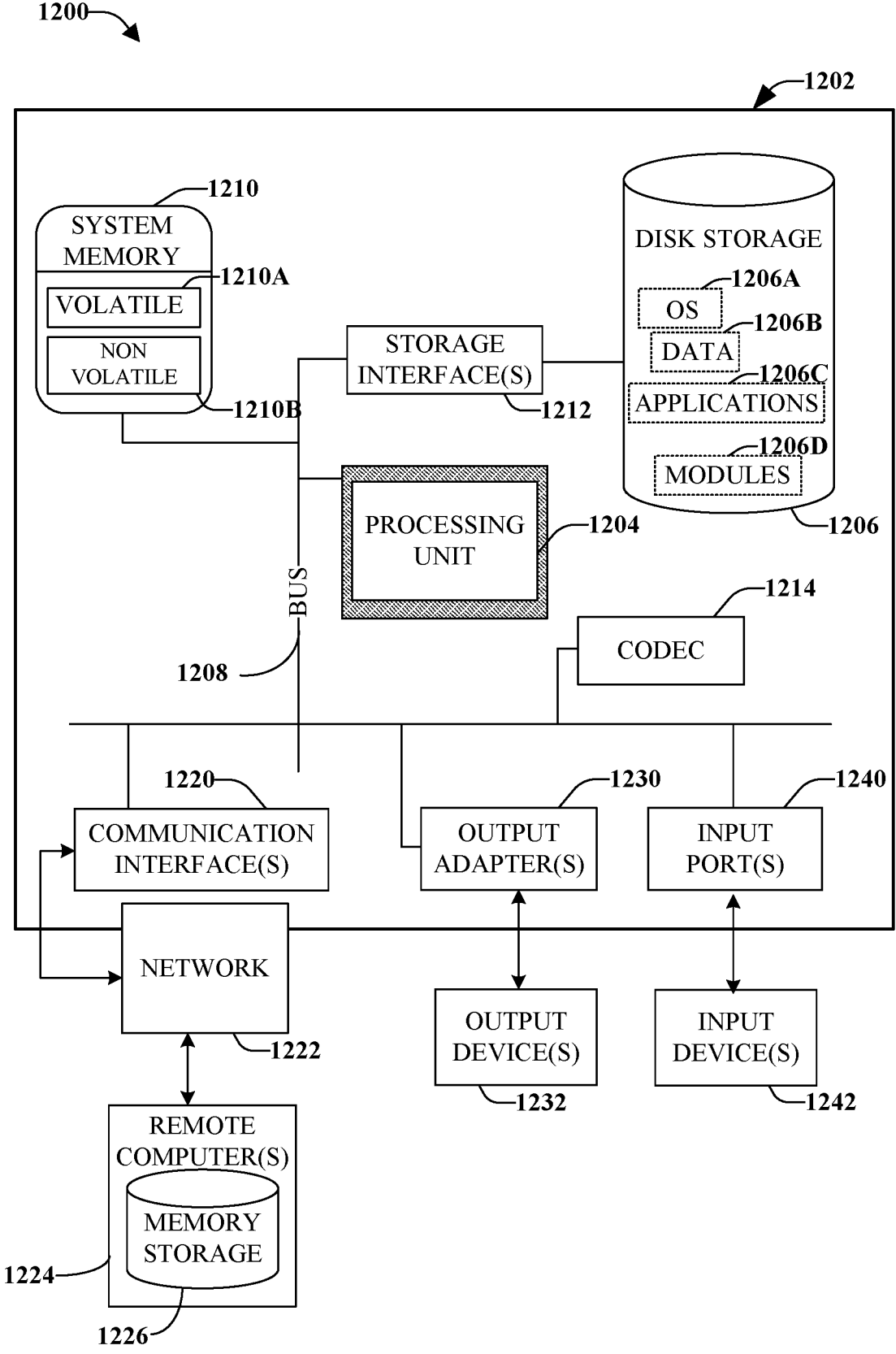
FIG. 12 illustrates a block diagram of an example computing environment for implementing one or more disclosed embodiments of the present disclosure.

In connection with FIG. 12, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 12, a suitable environment 1200 for implementing various aspects of the claimed subject matter includes a computer 1202. The computer 1202 includes a processing unit 1204, a system memory 1210, a codec 1214, and a system bus 1208. The system bus 1208 couples system components including, but not limited to, the system memory 1210 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1210 includes volatile memory 1210A and non-volatile memory 1210B. The basic input/output system (BIOS), containing the basic routines to transfer information between elements within the computer 1202, such as during start-up, is stored in non-volatile memory 1210B. In addition, according to present innovations, codec 1214 may include at least one of an encoder or decoder, wherein the at least one of an encoder or decoder may consist of hardware, software, or a combination of hardware and software. Although, codec 1214 is depicted as a separate component, codec 1214 may be contained within non-volatile memory 1210B. By way of illustration, and not limitation, non-volatile memory 1210B can include read only memory (ROM), programmable ROM (PROM), electrically programmable ROM (EPROM), electrically erasable programmable ROM (EEPROM), or flash memory, two-terminal memory, and so on. Volatile memory 1210A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1202 may also include removable/non-removable, volatile/non-volatile computer storage medium. FIG. 12 illustrates, for example, disk storage 1206. Disk storage 1306 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1206 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1206 to the system bus 1208, a removable or non-removable interface is typically used, such as storage interface 1212. It is appreciated that storage devices 1206 can store information related to a user. Such information might be stored at or provided to a server or to an application running on a user device. In one embodiment, the user can be notified (e.g., by way of output device(s) 1232) of the types of information that are stored to disk storage 1206 or transmitted to the server or application. The user can be provided the opportunity to opt-in or opt-out of having such information collected and/or shared with the server or application (e.g., by way of input from input device(s) 1242).

It is to be appreciated that FIG. 12 describes software that acts as an intermediary between users and the basic computer resources described in the suitable operating environment 1200. Such software includes an operating system 1206A. Operating system 1206A, which can be stored on disk storage 1206, acts to control and allocate resources of the computer system 1202. Applications 1206C take advantage of the management of resources by operating system 1206A through program modules 1206D, and program data 1206D, such as the boot/shutdown transaction table and the like, stored either in system memory 1210 or on disk storage 1206. It is to be appreciated that the claimed subject matter can be implemented with various operating systems or combinations of operating systems.

A user enters commands or information into the computer 1202 through input device(s) 1242. Input devices 1242 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via input port(s) 1240. Input port(s) 1240 include, for example, a serial port, a parallel port, a game port, and a universal serial bus (USB). Output device(s) 1232 use some of the same type of ports as input device(s) 1242. Thus, for example, a USB port may be used to provide input to computer 1202 and to output information from computer 1202 to an output device 1232. Output adapter 1230 is provided to illustrate that there are some output devices 1232 like monitors, speakers, and printers, among other output devices 1232, which require special adapters. The output adapters 1230 include, by way of illustration and not limitation, video and sound cards that provide a means of connection between the output device 1232 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1224. The remote computer(s) 1224 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1226 is illustrated with remote computer(s) 1224. Remote computer(s) 1224 is logically connected to computer 1202 through a network 1222 and then connected via communication interface(s) 1220. Network 1222 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1220 refers to the hardware/software employed to connect the network 1222 to the bus 1208. While communication interface(s) 1220 is shown for illustrative clarity inside computer 1202, it can also be external to computer 1202. The hardware/software necessary for connection to the network 1222 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g., 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device, comprising:

a resistive switching memory array comprising a plurality of resistive switching devices disposed overlying a substrate;

a control circuit for segregating a subset of the plurality of resistive switching devices thereby defining a first subset of the resistive switching devices;

an error correction control (ECC) encoder configured to generate correction data for data at the resistive switching memory array; and a sensing circuit disposed at least in part on the substrate and electrically coupled to the plurality of resistive switching devices, wherein the sensing circuit is configured to selectively apply a sense signal to a first resistive switching device of the first subset of the resistive switching devices, wherein the sensing circuit is configured to determine a first response signal from the first resistive switching device in response to the sense signal, and wherein the sensing circuit is configured to selectively apply the sense signal to a second resistive switching device of the first subset of the resistive switching devices, wherein the sensing circuit is configured to determine a second response signal from the second resistive switching device in response to the sense signal, wherein:

the control circuit defines a bit for the combination of the first resistive switching device and the second resistive switching device, the control circuit establishes a logic value for the bit based on the first response signal and second response signal, the control circuit establishes additional logic values for additional bits defined for respective additional pairs of the first subset of the resistive switching devices, the respective additional pairs excluding the first resistive switching device or excluding the second resistive switching device, and the bit and the additional bits defining a sequence of data, and the ECC encoder generates error correction data corresponding to the sequence of data.

2. The integrated circuit device of claim 1, wherein each of the plurality of resistive switching devices is associated with an operational programming characteristic having low correlation among resistive switching devices of the plurality of resistive switching devices and wherein the low correlation is defined by a correlation coefficient within a range of about −0.1 to about 0.1.

3. The integrated circuit device of claim 1, further comprising a command and data interface for receiving a command from a host device specifying an address associated with the plurality of resistive switching devices, and specifying a command causing the control circuit to select the first subset of the resistive switching devices from the address.

4. The integrated circuit device of claim 1, wherein the sensing circuit is configured to read the sequence of data and provide the sequence of data to the ECC encoder to generate the error correction data.

5. The integrated circuit device of claim 1, wherein the control circuit is configured to at least one of:

apply a strong program pulse to the first resistive switching device in response to the first response signal being a program response; or apply the strong program pulse to the second resistive switching device in response to the second response signal being the program response.

* * * * *